United States Patent
Motohashi et al.

(10) Patent No.: US 10,375,817 B2
(45) Date of Patent: Aug. 6, 2019

(54) SEMICONDUCTOR DEVICE

(71) Applicant: RENESAS ELECTRONICS CORPORATION, Tokyo (JP)

(72) Inventors: Norikazu Motohashi, Tokyo (JP); Tomohiro Nishiyama, Tokyo (JP); Tadashi Shimizu, Tokyo (JP); Shinji Nishizono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/480,920

(22) Filed: Apr. 6, 2017

(65) Prior Publication Data

US 2017/0303389 A1    Oct. 19, 2017

(30) Foreign Application Priority Data

Apr. 15, 2016  (JP) .................................. 2016-081941

(51) Int. Cl.
*H05K 1/02*    (2006.01)
*H05K 1/11*    (2006.01)
(Continued)

(52) U.S. Cl.
CPC .......... *H05K 1/0215* (2013.01); *H05K 1/0218* (2013.01); *H05K 5/0065* (2013.01);
(Continued)

(58) Field of Classification Search
CPC ........ H05K 1/0216; H05K 1/11; H05K 1/115; H05K 7/1427; H05K 2201/10166;
(Continued)

(56) References Cited

U.S. PATENT DOCUMENTS

| 4,851,614 A * | 7/1989 | Duncan, Jr. .......... H05K 1/0215 174/263 |
| 5,326,937 A * | 7/1994 | Watanabe ............ H05K 1/0215 174/262 |

(Continued)

FOREIGN PATENT DOCUMENTS

| JP | 07-225634 A | 8/1995 |
| JP | 2002-261410 A | 9/2002 |

(Continued)

OTHER PUBLICATIONS

Japanese Notification of Reasons for Refusal issued in corresponding Japanese Patent Application No. 2016-081941, dated Jun. 18, 2019, with English Translation.

*Primary Examiner* — David M Sinclair
*Assistant Examiner* — Theron S Milliser
(74) *Attorney, Agent, or Firm* — McDermott Will & Emery LLP

(57) ABSTRACT

An electronic device has a control board having a plurality of wiring layers, a metal-made housing supporting the control board, and a fixing screw for fixing the control board to the housing through a washer. The control board includes a through hole penetrating from a third surface to a fourth surface, a through electrode formed inside the through hole, and a power system GND pattern formed on any wiring layer of the wiring layers. The power system GND pattern and the housing are electrically coupled through the through electrode, the washer, and the fixing screw.

18 Claims, 23 Drawing Sheets

(51) Int. Cl.
*H05K 5/00* (2006.01)
*H05K 9/00* (2006.01)

(52) U.S. Cl.
CPC ........... *H05K 9/0039* (2013.01); *H05K 1/115* (2013.01); *H05K 1/116* (2013.01); *H05K 2201/0723* (2013.01); *H05K 2201/09354* (2013.01); *H05K 2201/09618* (2013.01); *H05K 2201/09972* (2013.01); *H05K 2201/10166* (2013.01); *H05K 2201/10409* (2013.01)

(58) Field of Classification Search
CPC .. H05K 1/0215; H05K 9/0039; H05K 1/0218; H05K 5/0065; H05K 2201/09354; H05K 2201/09618; H05K 2201/09972; H05K 1/116; H05K 2201/10409; H05K 2201/0723; H01F 27/42
See application file for complete search history.

(56) References Cited

U.S. PATENT DOCUMENTS

| | | | | |
|---|---|---|---|---|
| 5,420,378 A * | 5/1995 | Estes | .................... | H05K 1/0215 |
| | | | | 174/261 |
| 5,500,789 A * | 3/1996 | Miller | .................. | H05K 1/0218 |
| | | | | 174/351 |
| 6,344,972 B2 * | 2/2002 | Estieule | ................... | H01R 4/64 |
| | | | | 361/753 |
| 6,493,233 B1 * | 12/2002 | De Lorenzo | ........... | H05K 3/325 |
| | | | | 174/138 G |
| 6,794,581 B2 * | 9/2004 | Smith | .................. | H05K 1/0263 |
| | | | | 174/260 |
| 7,088,591 B2 * | 8/2006 | Kishimoto | ........... | H05K 1/0215 |
| | | | | 29/846 |
| 7,357,645 B2 * | 4/2008 | Jeong | ..................... | H05K 7/142 |
| | | | | 439/66 |
| 7,436,654 B2 * | 10/2008 | Cho | .................. | H05K 7/20963 |
| | | | | 361/679.27 |
| 7,452,219 B2 * | 11/2008 | Kitajima | ................ | H01R 4/028 |
| | | | | 439/108 |
| 2005/0079748 A1 * | 4/2005 | Kim | ........................ | H01R 4/66 |
| | | | | 439/92 |
| 2007/0085193 A1 * | 4/2007 | Kashiwakura | .......... | H01L 23/50 |
| | | | | 257/698 |
| 2008/0080111 A1 * | 4/2008 | Lin | ................... | H01L 21/76816 |
| | | | | 361/56 |
| 2009/0008771 A1 * | 1/2009 | Torii | ................... | H01L 23/3675 |
| | | | | 257/713 |
| 2009/0135573 A1 * | 5/2009 | Sato | ........................ | H05K 1/144 |
| | | | | 361/803 |
| 2009/0212425 A1 * | 8/2009 | Ito | ........................... | H01L 22/32 |
| | | | | 257/737 |
| 2011/0141707 A1 * | 6/2011 | Hasegawa | ............ | H05K 1/0215 |
| | | | | 361/753 |

FOREIGN PATENT DOCUMENTS

| | | |
|---|---|---|
| JP | 2003-243855 A | 8/2003 |
| JP | 2004-158777 A | 6/2004 |
| JP | 2014-220383 A | 11/2014 |

* cited by examiner

SEMICONDUCTOR DEVICE

CROSS-REFERENCE TO RELATED APPLICATIONS

The disclosure of Japanese Patent Application No. 2016-081941 filed on Apr. 15, 2016 including the specification, drawings and abstract is incorporated herein by reference in its entirety.

The present invention relates to a semiconductor device and a semiconductor device including, for example, a wiring substrate and a metal-made case in which the wiring substrate is mounted.

BACKGROUND

Japanese Unexamined Patent Application Publication No. 2002-261410 discloses that a common mode current is controlled in the printed wiring substrate, as a noise countermeasure in electronic units including the wiring substrate.

For example, Japanese Unexamined Patent Application Publication No. 2003-243855 discloses a reduction of electrostatic noise entering the circuit substrate.

SUMMARY

A choke coil is used as a countermeasure for the common mode noise flowing through the GND, in an electronic device including a wiring substrate and a metal-made case in which the wiring substrate is mounted.

In this case, because the choke coil has a large size, the size of the wiring substrate is enlarged as well. This causes an increase in the cost. Thus, it is necessary to reduce the common mode noise without using the choke coil.

Other objects and new features will be apparent from the descriptions of the present specification and the accompanying drawings.

According to one embodiment, there is provided an electronic device including a wiring substrate and a metal-made case which supports the wiring substrate. The wiring substrate has a first surface, a second surface, and a plurality of wiring layers arranged between the first surface and the second surface. The wiring substrate includes a first through hole, a through electrode, and a conductor pattern. The first through hole penetrates from one surface to the other surface, of a surface on which the uppermost wiring layer of the wiring layers is formed and a surface on which the lowermost wiring layer is formed. The through electrode is formed inside the first through hole. The conductor pattern is formed on a wiring layer positioned on a side inner, in a substrate thickness direction, than the uppermost and lowermost layers, of the wiring layers. The conductor pattern and the case are electrically coupled through the through electrode.

According to the one embodiment, it is possible to reduce the common mode noise in the electronic device.

DETAILED DESCRIPTION

Figure 1:
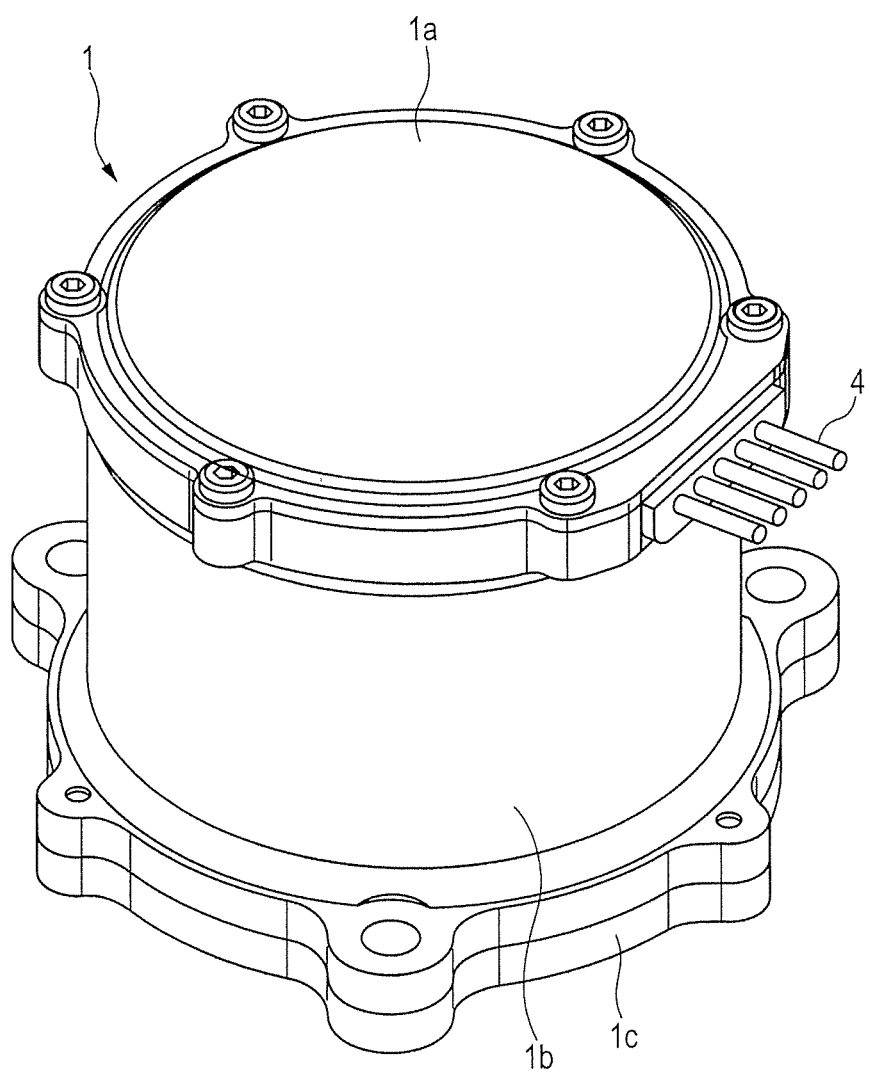
FIG. 1 is an external perspective diagram showing an example of an electronic device of an embodiment 1.

In the following preferred embodiments, unless otherwise necessary, the same or similar parts will not generally be described repeatedly over and over.

Further, in the following preferred embodiments, if necessary for convenience sake, descriptions will be made to divided plural sections or preferred embodiments, however, unless otherwise specified, they are not mutually irrelevant, but one is in relations of modifications, application examples, details, supplementary explanations of a part or whole of the other.

In the following preferred embodiments, in the case of reference to the number of elements (including quantity, numeric value, amount, range), unless otherwise specified and unless clearly limited in principle, the present invention is not limited to the specified number, and a number over or below the specified one may be used.

In the following preferred embodiments, needless to say, the constituent elements (including element steps) are not necessarily indispensable, unless otherwise specified and unless considered that they are obviously required in principle.

In the following preferred embodiments, for the constituent elements, needless to say, each of those terms "formed from A", "formed of A", "has A", and "include A" is not to exclude any other elements, unless specified that only the element is included. Similarly, in the following preferred embodiments, in the reference of the faults of the constituent elements or the positional relationships, they intend to include those approximating or similar substantially to the forms and like, unless otherwise specified and unless considered that they are obviously not required in principle. This is also true of the foregoing numerical values and range.

Descriptions will now specifically be made to the preferred embodiments of the present invention based on the accompanying drawings. In the entire illustrations for describing the preferred embodiments, those members having the same function are identified by the same reference numerals, and are not described repeatedly over and over. For the sake of simply illustration, hatching may be made even in the plan view.

Embodiment 1

Figure 2:
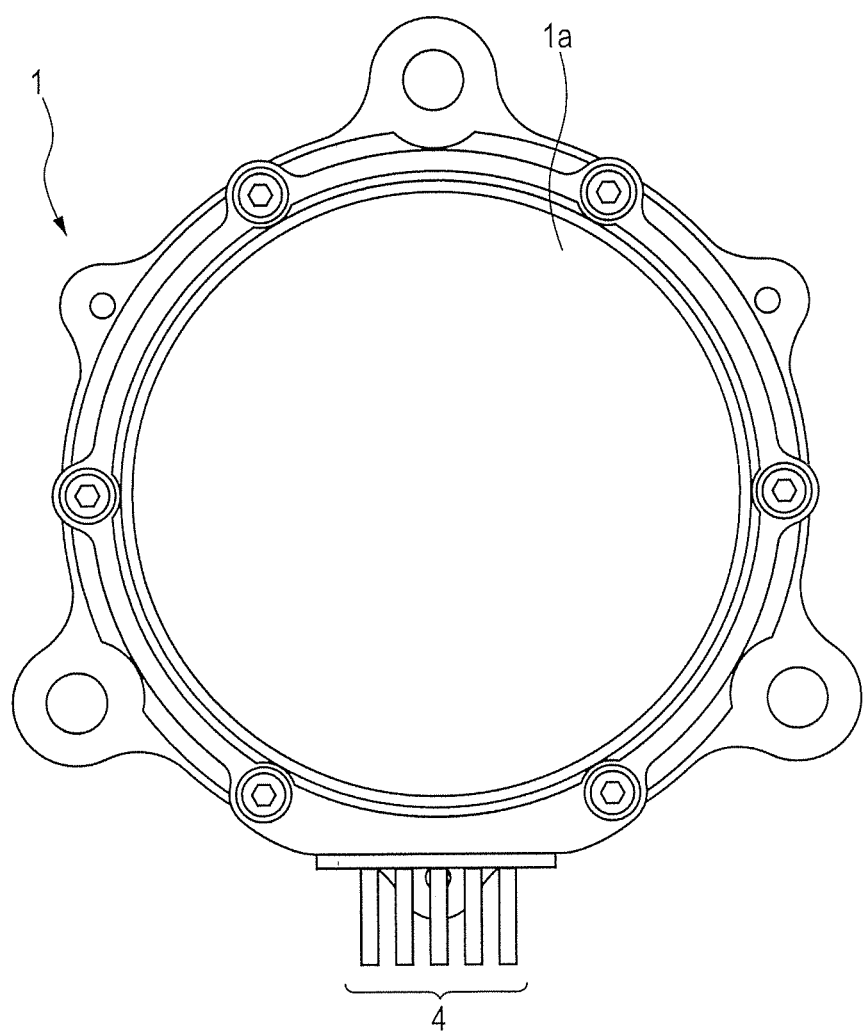
FIG. 2 is a plan view showing a structure example of the electronic device illustrated in FIG. 1.
Figure 3:
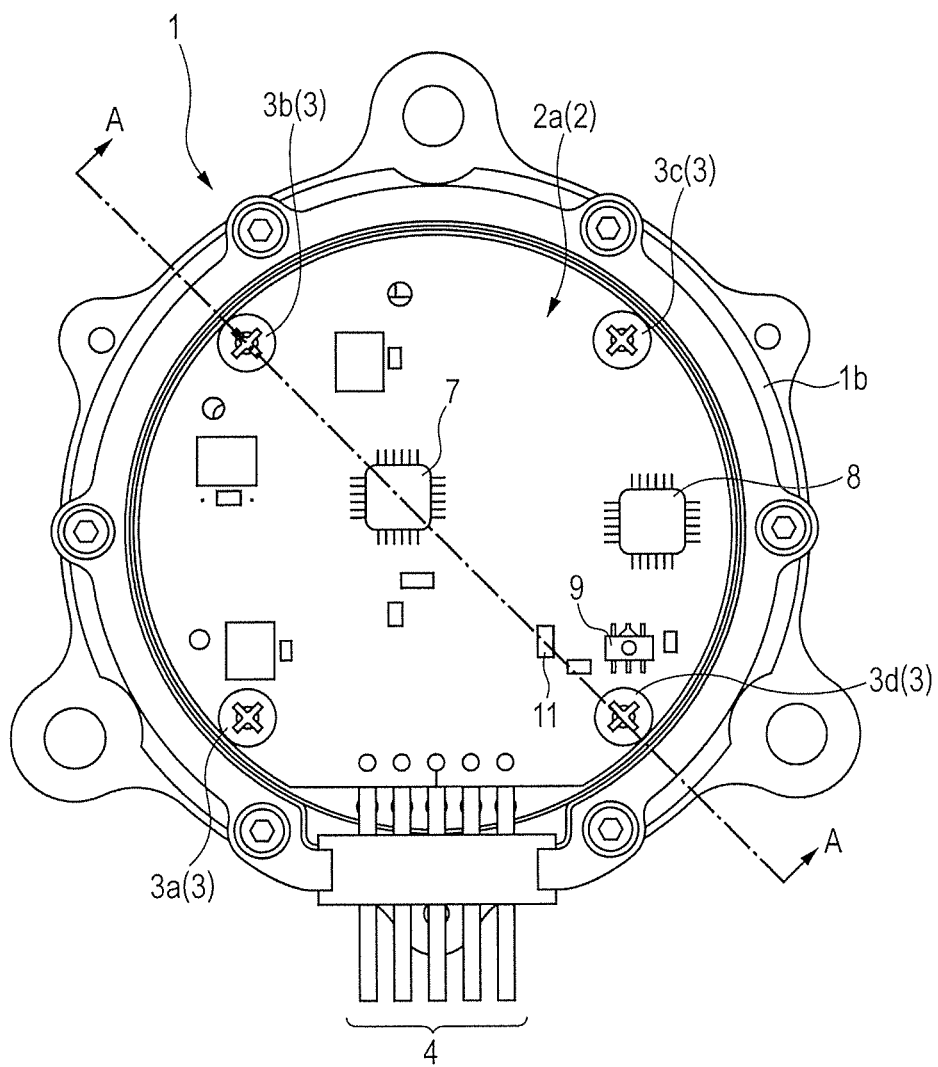
FIG. 3 is a plan view showing an example of an internal structure in the electronic device illustrated in FIG. 1.
Figure 4:
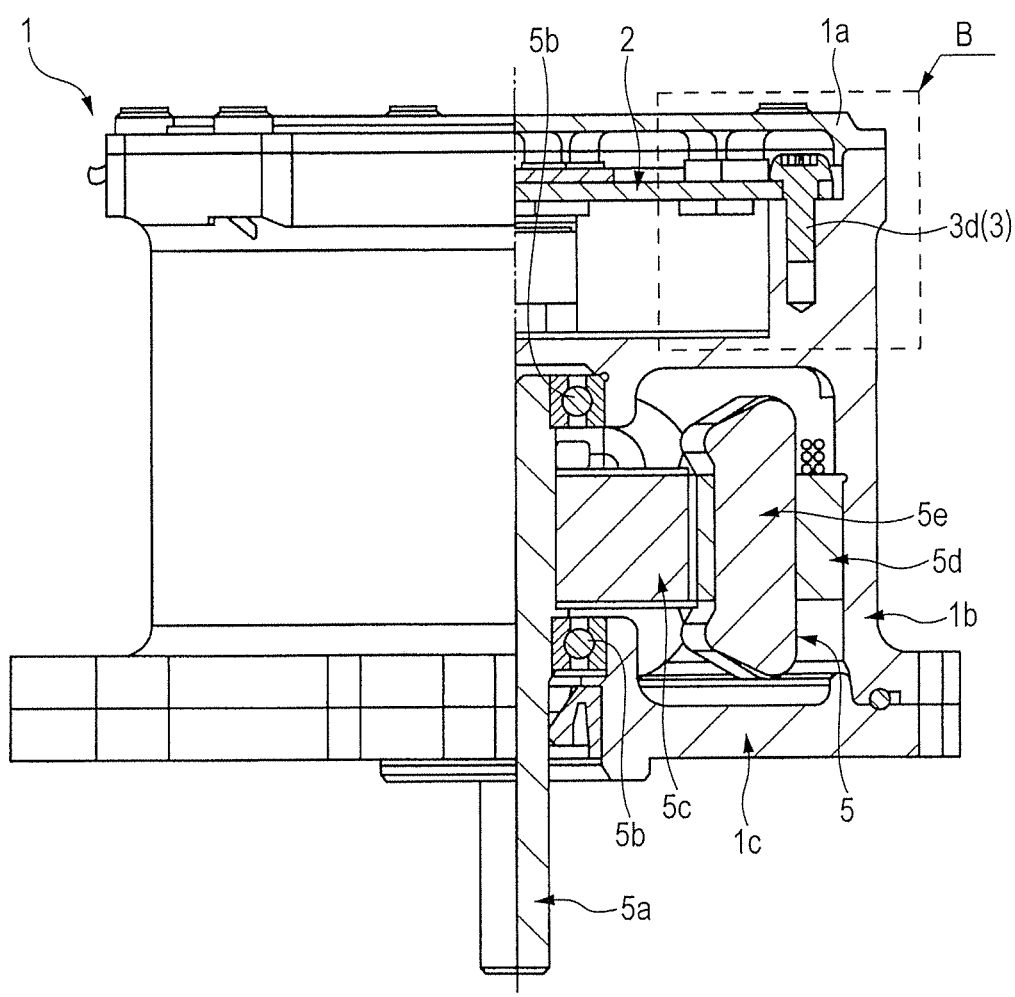
FIG. 4 is a partial cross sectional view showing an example of a partially broken structure taken along a line A-A of FIG. 3.
Figure 5:
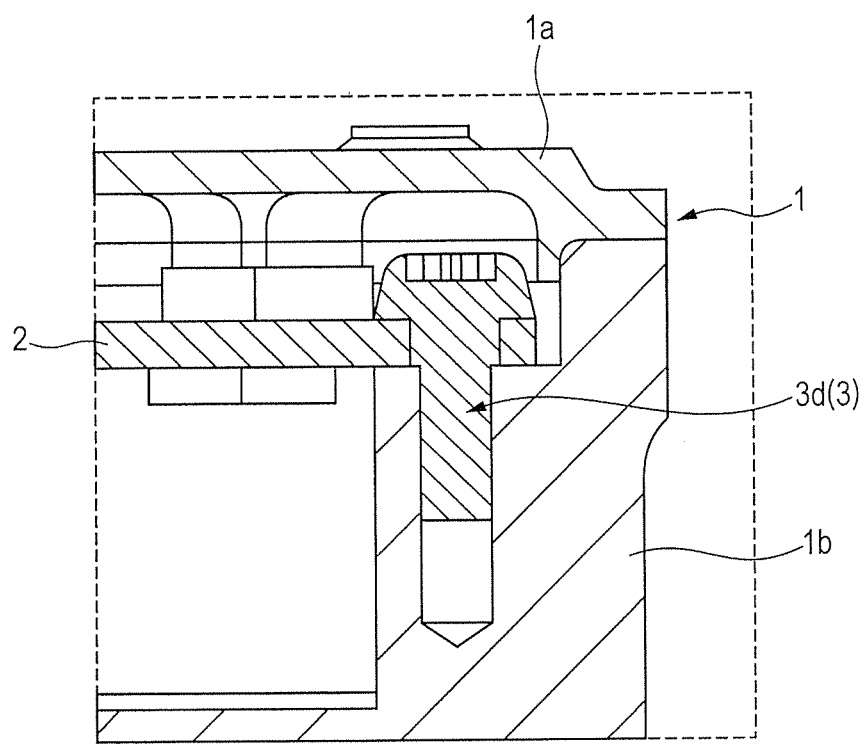
FIG. 5 is a partially enlarged cross sectional view showing a structure example of a B part of FIG. 4.

FIG. 1 is an external perspective diagram illustrating an example of an electronic device of an embodiment 1. FIG. 2 is a plan view showing a structure example of the electronic device illustrated in FIG. 1. FIG. 3 is a plan view showing an example of an internal structure in the electronic device illustrated in FIG. 1. FIG. 4 is a partial cross sectional view showing an example of a partially broken structure taken along a line A-A of FIG. 3. FIG. 5 is a partially enlarged cross sectional view showing a structure example of a B part of FIG. 4.

Descriptions will now be made to a structure of the electronic device of the embodiment 1. The electronic device 1 illustrated in FIG. 1 to FIG. 3 includes a control board 2 and a metal-made case supporting this control board 2, for example, an inverter board having electronic parts mounted on the wiring substrate (substrate). The electronic device 1 has a motor 5 incorporated therein. The control board 2 is a substrate for controlling the motor 5. When the electronic device 1 is an on-vehicle device, the motor 5 is an electric oil pump for realizing idling stop for vehicles, by being coupled to a pump mechanism of, for example, an internal gear type.

As illustrated in FIG. 2, the form in the plan view of the electronic device 1 has a circular shape. If a cover 1a is removed, as illustrated in FIG. 3, a surface (a first surface, upper surface) 2a of the control board 2 can be seen.

As illustrated in FIG. 4, the case is formed of a cover 1a arranged on the upper side, a cylindrical housing 1b fixed to the control board 2, and a bracket 1c arranged on the lower side. They are made of metal including, for example, an aluminum alloy. As illustrated in FIG. 5, the control board 2 is attached to the housing 1b by a fixing screw (coupling member) 3. That is, the control board 2 is supported by the metal fixing screw 3. In the electronic device 1 of the embodiment 1, as illustrated in FIG. 3, the control board 2 is fixed to the housing 1b by screws at four points. Specifically, it is fixed to the housing 1b by four fixing screws 3, which are a first fixing screw (coupling member) 3a, a second fixing screw (coupling member) 3b, a third fixing screw (coupling member) 3c, and a fourth fixing screw (coupling member) 3d.

As illustrated in FIG. 4, the motor 5 is arranged on the side of a back surface (a second surface, lower surface) 2b of the control board 2, and contained in the housing 1b and the bracket 1c. The motor 5 includes a rotor shaft 5a as an output shaft, a rotor core 5c rotating with the rotor shaft 5a, a bearing 5b supporting the rotor shaft 5a, a stator core 5d as a stator fixed by being press-fitted to the housing 1b, and a winding 5e as a conductor wire with an insulating film wound around the stator core 5d.

As illustrated in FIG. 3, the electronic device 1 is electrically coupled to the wiring of the control board 2, and has five lead wires 4 as external coupling terminals lead from the control board 2.

On the surface 2a of the control board 2, various ICs (Integrated Circuits) or electronic parts are mounted.

Figure 6:
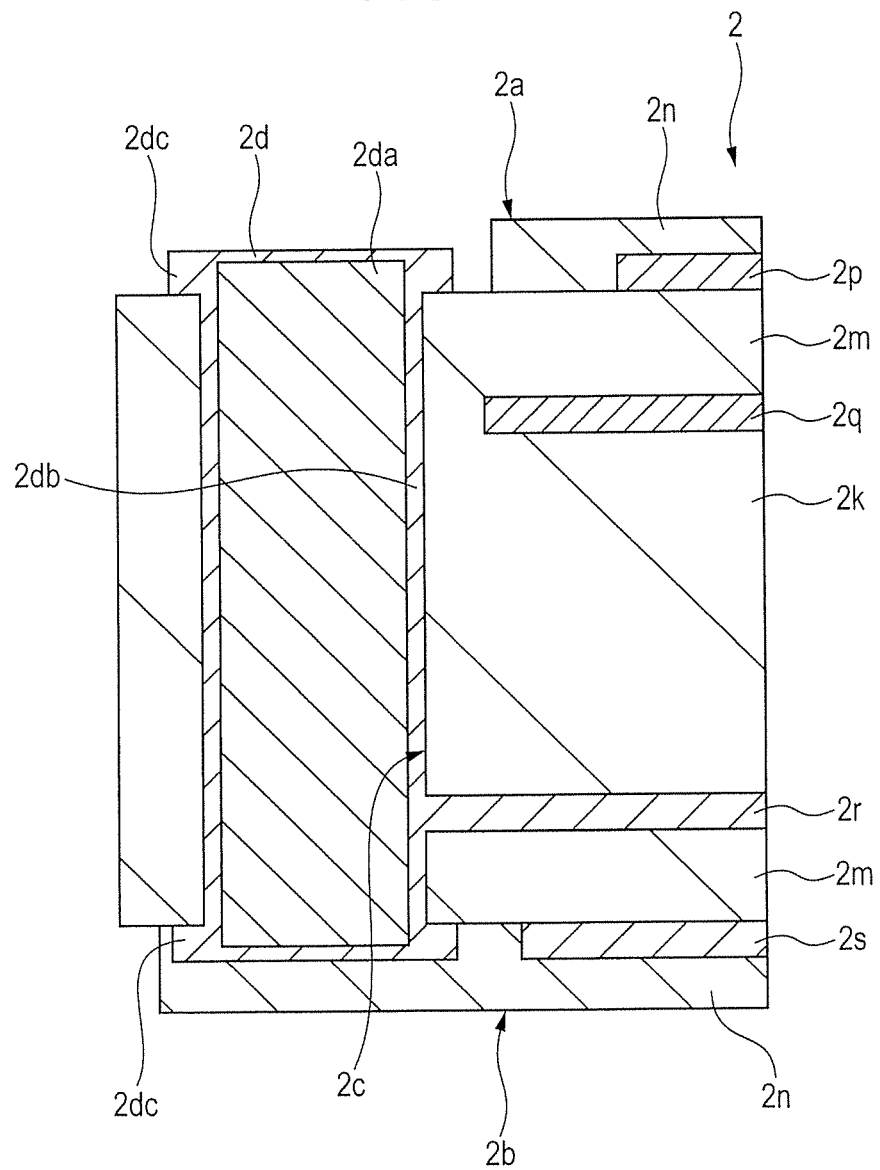
FIG. 6 is a partially enlarged cross sectional view showing a structure example of a wiring substrate mounted on the electronic device of FIG. 1.
Figure 7:
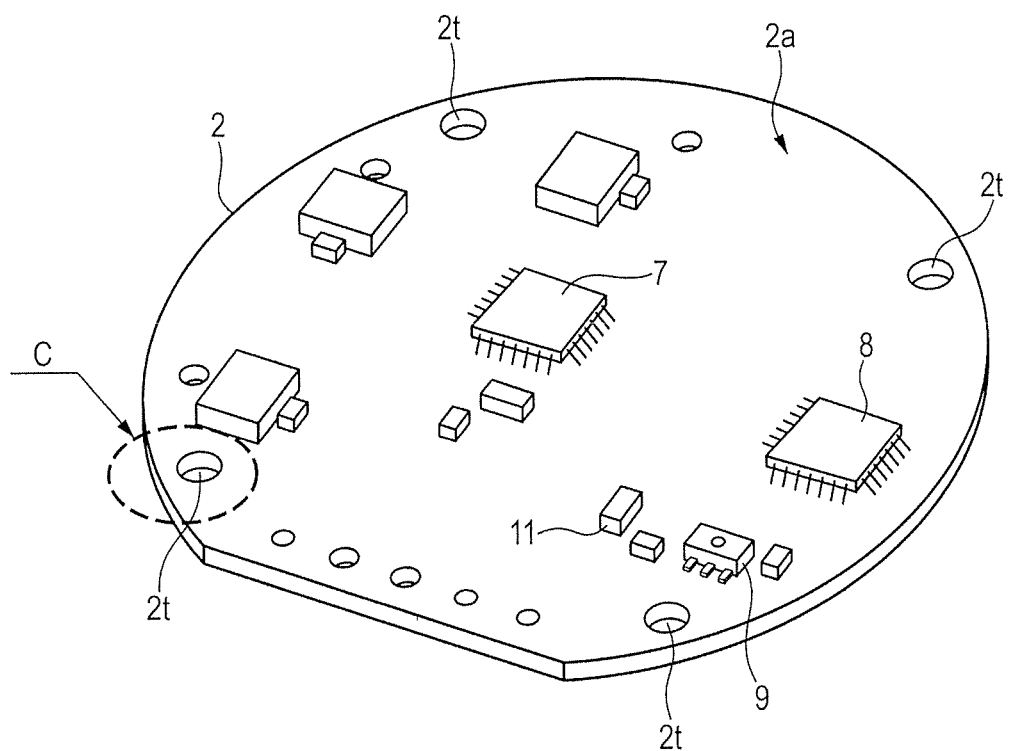
FIG. 7 is a perspective view showing a layout example of parts mounted on the surface of the wiring substrate of FIG. 6.
Figure 8:
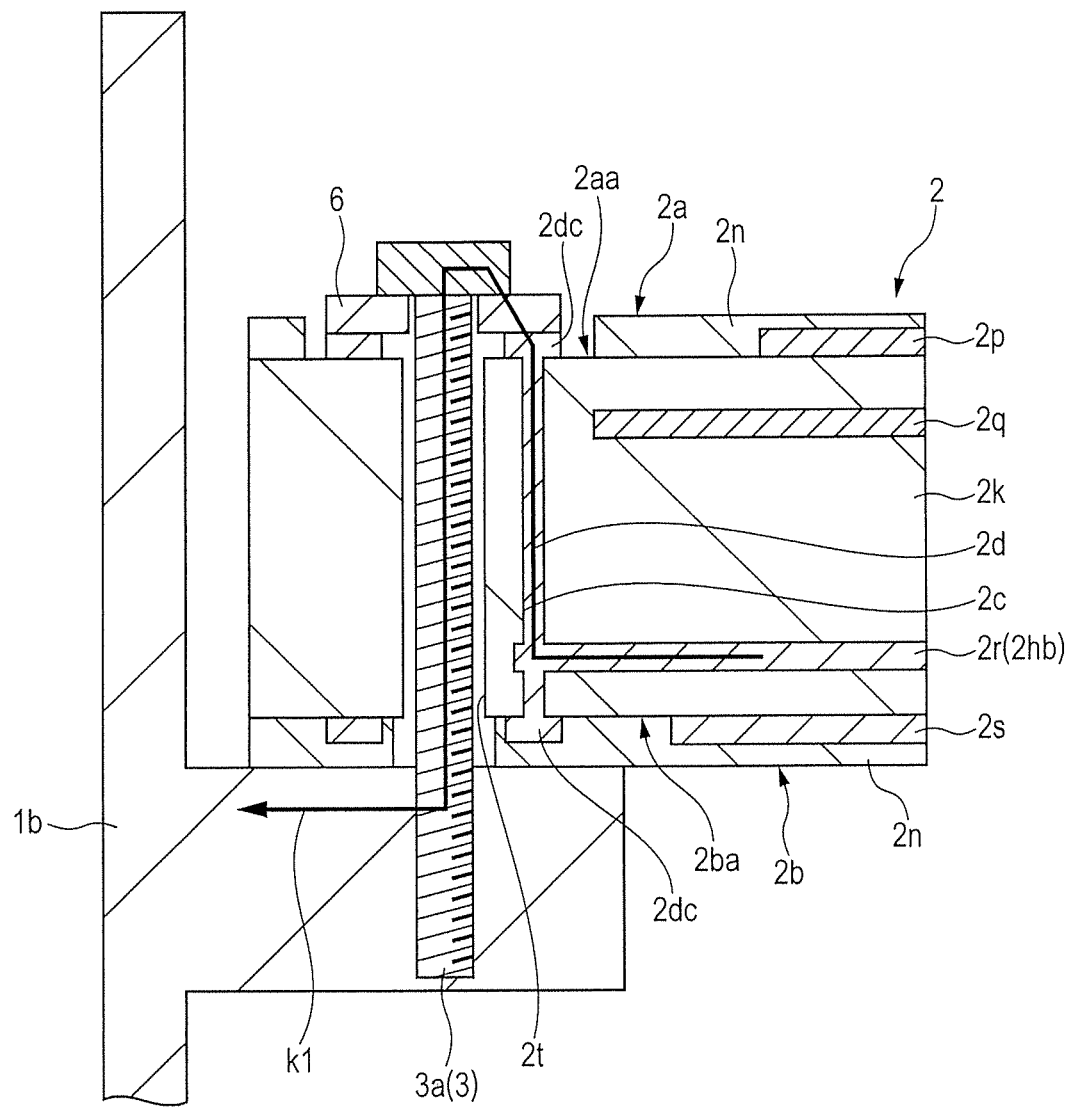
FIG. 8 is a partially enlarged cross sectional view showing an example of a substrate fixing structure in a C part of FIG. 7.

Descriptions will be now made to a structure and a substrate fixing structure of the control board 2 of the embodiment 1, using FIG. 6 to FIG. 8. FIG. 6 is a partially enlarged cross sectional view showing a structure example of a wiring substrate mounted on the electronic device of FIG. 1. FIG. 7 is a perspective view showing a layout example of parts mounted on the surface of the wiring substrate of FIG. 6. FIG. 8 is a partially enlarged cross sectional view showing an example of a substrate fixing structure in a C part of FIG. 7.

Descriptions will now be made to a structure of the control board 2 of the embodiment 1. As illustrated in FIG. 6, the control board 2 has the surface 2a, the back surface 2b on the opposite side to the surface 2a, and a plurality of wiring layers arranged between the surface 2a and the back surface 2b. In the embodiment 1, descriptions will be made to a case in which the control board 2 is a subtractive substrate having four wiring layers, by way of example.

In the control board 2 of the embodiment 1, the wiring layer formed on a third surface 2aa on the side of the surface 2a is defined as a first wiring layer (L1) 2p, while the wiring layer formed on a fourth surface 2ba on the side of the back surface 2b is defined as a fourth wiring layer (L4) 2s. The control board 2 has four wiring layers, which are the first wiring layer (L1) 2p, a second wiring layer (L2) 2q, a third wiring layer (L3) 2r, and the fourth wiring layer (L4) 2s, sequentially from the side of the surface 2a to the side of the back surface 2b.

Thus, of the four wiring layers, the second wiring layer (L2) 2q and the third wiring layer (L3) 2r are formed (arranged) inside the substrate. Specifically, the second wiring layer (L2) 2q and the third wiring layer (L3) 2r are positioned on the side inner, in a substrate thickness direction, than the wiring layers of the first wiring layer (L1) 2p as the uppermost layer and the fourth wiring layer (L4) 2s of the lowermost layer.

The first wiring layer 2p on the side of the surface 2a and the fourth wiring layer 2s on the side of the back surface 2b are covered by a solder resist 2n as insulating films.

A core layer 2k as an insulating layer to be the core is formed between the second wiring layer 2q and the third wiring layer 2r. Further, a prepreg 2m as an insulating layer is formed between the first wiring layer 2p and the second wiring layer 2q and also between the third wiring layer 2r and the fourth wiring layer 2s.

The control board 2 includes a through hole (a first through hole) 2c and a through electrode 2d formed inside the through hole 2c. The through hole 2c penetrates from the third surface 2aa having the first wiring layer 2p formed therein toward the fourth surface 2ba having the fourth wiring layer 2s (or from the fourth surface 2ba toward the third surface 2aa) formed therein. The through electrode 2d is formed by filling the through hole 2c with a conductive paste 2da. Further, on the inner peripheral wall of the through hole 2c, through hole plating 2db is formed.

On the control board 2, the through electrode 2d is electrically coupled directly to any of the wiring layers inside the substrate through the through hole plating 2db, and a GND (ground) pattern is formed on the wiring layer to which the through electrode 2d is directly and electrically coupled. In the embodiment 1, descriptions will hereinafter be made to a case in which the through electrode 2d is directly and electrically coupled to the third wiring layer 2r through the through hole plating 2db. Thus, on the third wiring layer 2r, a GND pattern 2h, as will be described later, (see FIG. 12) is formed.

On the control board 2, of the above-described GND pattern 2h of the third wiring layer 2r to which a GND (ground) potential is supplied, a power system GND pattern (see FIG. 12, a semiconductor pattern, and a second conductor pattern) 2hb and the above-described housing 1b are electrically coupled through the through electrode 2d as illustrated in FIG. 8.

On the control board 2, in the second wiring layer 2q and the fourth wiring layer 2s, at least one kind of wiring pattern is formed.

Descriptions will now be made to a substrate fixing structure of the embodiment 1 illustrated in FIG. 8. The structure illustrated in FIG. 8 is a fixing structure of the through hole (a second through hole) 2t of a C part of the control board 2 illustrated in FIG. 7. In this case, the above-described first surface is the uppermost surface of the control board 2, and the above-described second surface is the lowermost surface of the control board 2. The through hole (the second through hole) 2t is opened to the uppermost surface and the lowermost surface.

As illustrated in FIG. 8, in the embodiment 1, the power system GND pattern 2hb of the third wiring layer 2r of the control board 2 and the housing (case) 1b are electrically coupled, using the fixing screw 3 for fixing the control board 2 to the housing 1b.

In this case, the control board 2 is fixed to the housing 1b using the fixing screw 3 passing through the through hole 2t, through a washer 6 interposed therebetween. The through electrode 2d is formed on the third surface 2aa and the fourth surface 2ba, and includes a ring-shaped conductor pattern (another conductor pattern) 2dc arranged to cover (to surround) the outer peripheral part of the fixing screw 3. On the side of the surface 2a, the washer (a plate conductor member) 6 is fixed to be in contact with the conductor pattern 2dc of the through electrode 2d by the fixing screw 3. As a result, the power system GND pattern 2hb of the third wiring layer 2r is coupled to the housing (case) 1b for GND through the through electrode 2d, the washer 6, and the fixing screw 3, using a conduction path k1. That is, the power system GND pattern 2hb of the third wiring layer 2r of the control board 2 and the housing 1b as the case are electrically coupled, using the conduction path k1.

Figure 9:
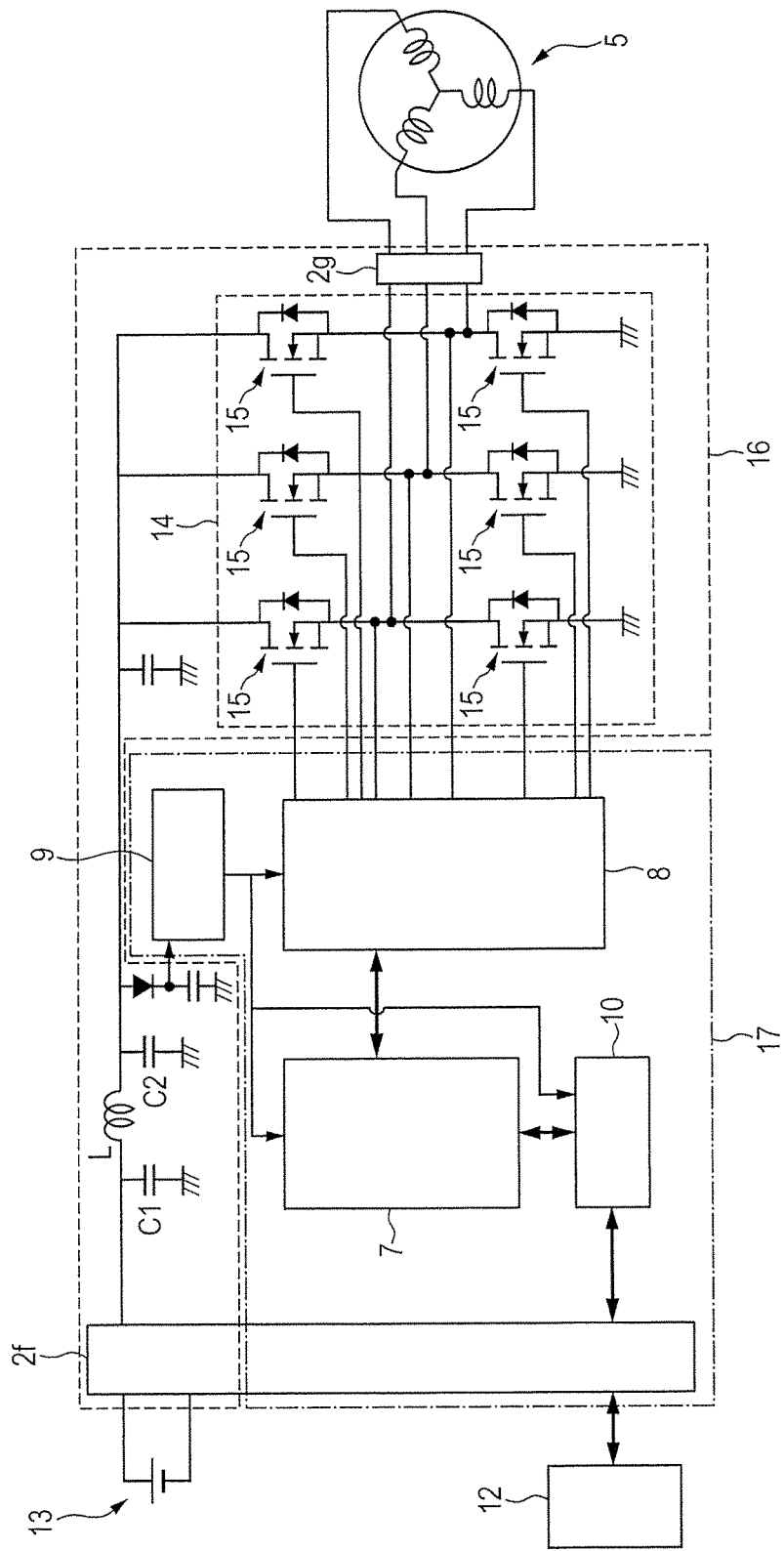
FIG. 9 is a circuit block diagram of the wiring substrate mounted on the electronic device of FIG. 1.
Figure 10:
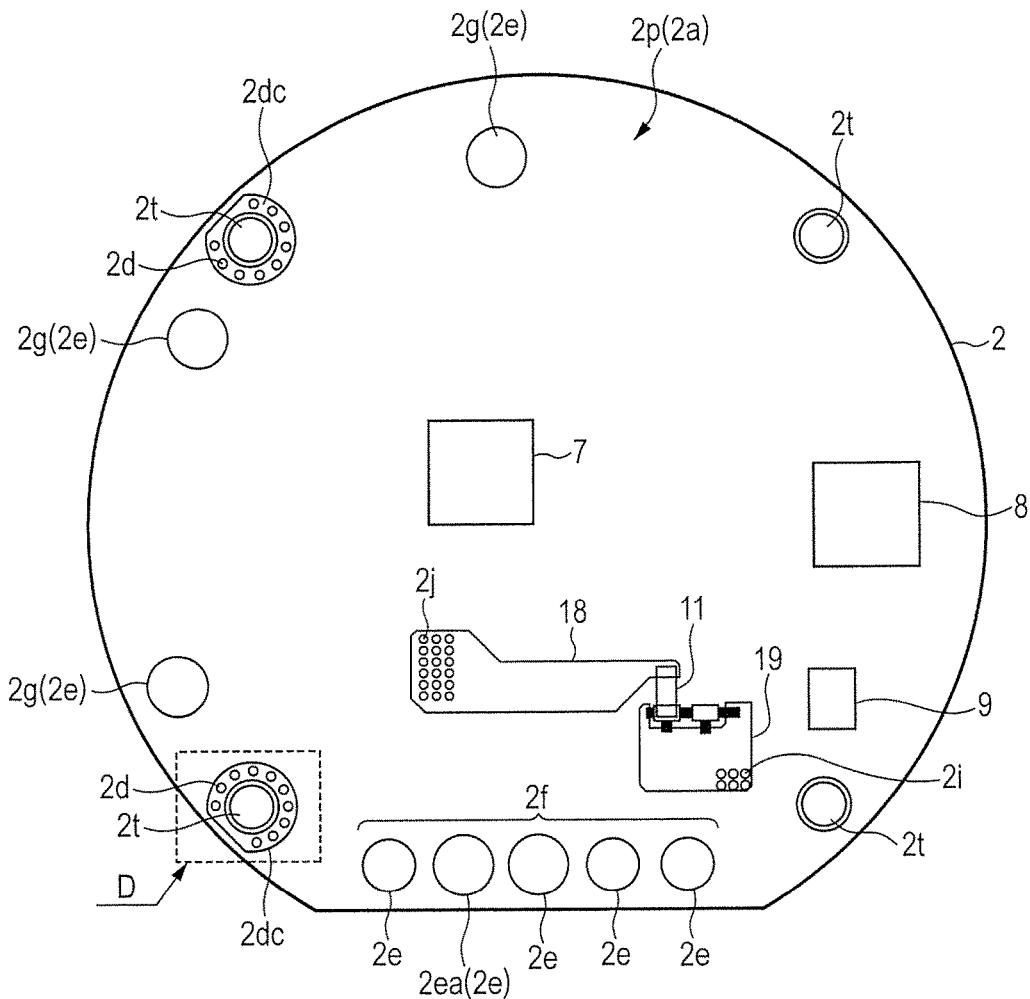
FIG. 10 is a plan view showing a structure example of a first layer of the wiring substrate mounted on the electronic device of FIG. 1.
Figure 11:
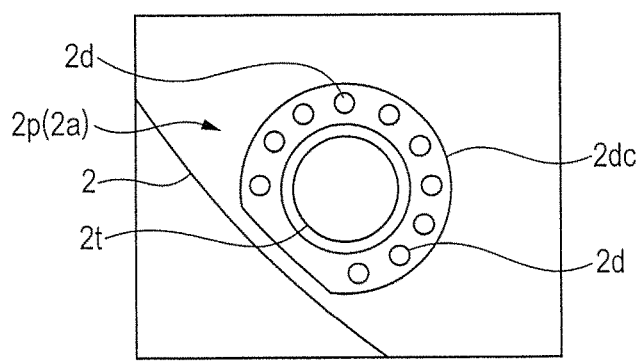
FIG. 11 is a partially enlarged plan view showing an enlarged structure example of a D part of FIG. 10.
Figure 12:
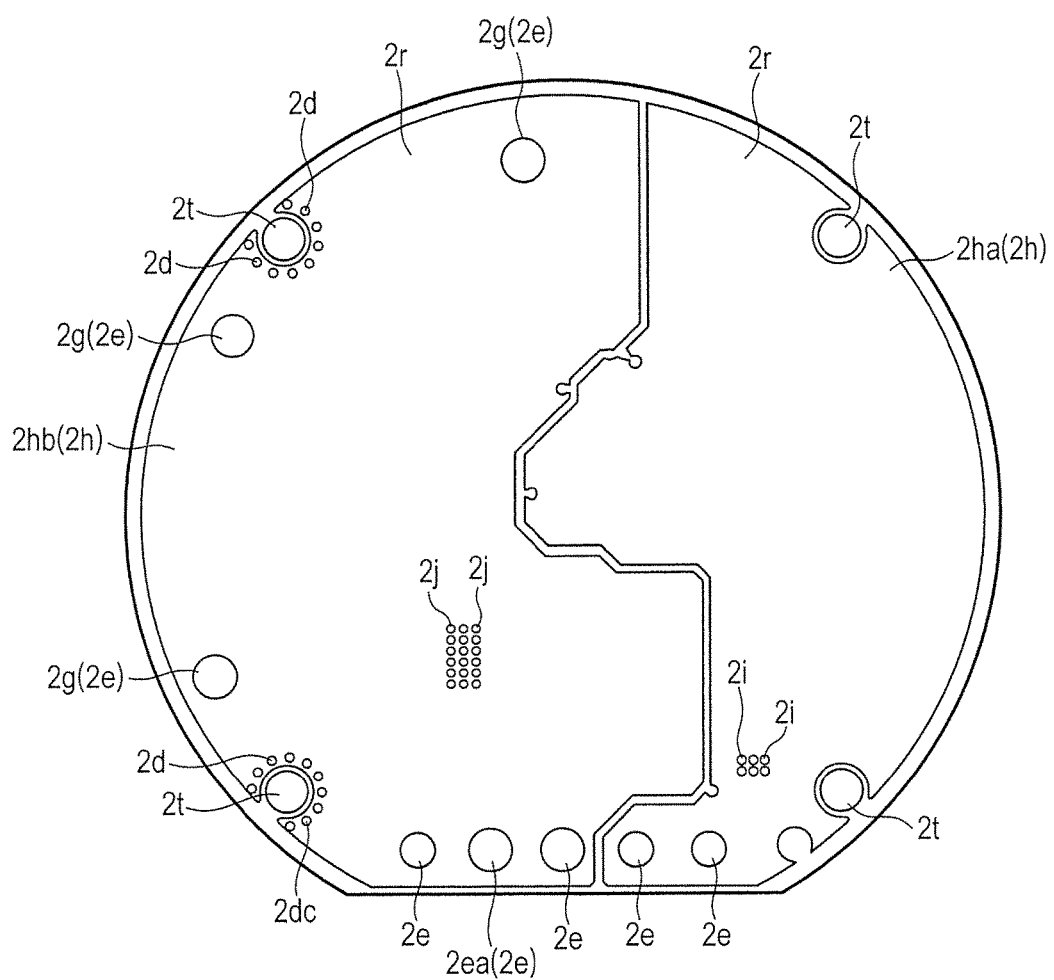
FIG. 12 is a plan view showing a structure example of a third layer of the wiring substrate mounted on the electronic device of FIG. 1.

Descriptions will now be made to electronic parts mounted on the control board 2 and a circuit of the control board 2 formed of the electronic parts. FIG. 9 is a circuit block diagram of the wiring substrate mounted on the electronic device of FIG. 1. FIG. 10 is a plan view showing a structure example of a first layer of the wiring substrate mounted on the electronic device of FIG. 1. FIG. 11 is a partially enlarged plan view showing an enlarged structure example of a D part of FIG. 10. FIG. 12 is a plan view showing a structure example of a third layer of the wiring substrate mounted on the electronic device of FIG. 1.

The circuit of the control board 2 of the embodiment 1 can be briefly divided into a power system area 16 and a logic system area (control system area) 17, as illustrated in FIG. 9. A large current flows through the power system area 16, while only a small current flows through the logic system area 17 as compared to the power, system area 16.

The power system area 16 includes an inverter circuit 14. This inverter circuit 14 is configured with a plurality of MOSFETs (Metal Oxide Semiconductor Field Effect Transistors) 15 as switching elements. The circuit of the embodiment 1 is to drive the motor 5, as an example, and is a three-phase inverter circuit 14 formed of a combination of six power MOSFETs 15. Thus, the control board 2 is also an inverter board. That is, as described above, a large current flows through the power system area 16.

On the logic system area 17, an MCU (Micro Controller Unit) 7, a pre-driver 8, a regulator 9, and a communication IC 10 are mounted.

A power source is supplied to the inverter circuit 14 via a noise filter of a capacitor C1/coil L/capacitor C2, from a battery 13 coupled to a coupling through hole (a first connector) 2f, in the power system area 16, for example. A source voltage is stepped down by the regulator 9 in the logic system area 17, and supplied to the MCU 7, the pre-driver 8, and the communication IC 10. That is, a second voltage higher than a first voltage to be applied to the logic system area 17 is applied to the power system area 16.

Communication is performed through the communication IC 10, between the MCU 7 and an ECU (Electronic Control Unit) 12 which is externally provided and coupled to the coupling through hole 2f.

Accordingly, the MCU 7 generates a control signal based on an instruction from the external higher ECU 12. In response to this control signal, and the pre-driver 8 drives the inverter circuit 14. Driving of this inverter circuit 14 causes to control rotation of the motor 5 coupled to a coupling through hole (a second connector) 2g.

The above-described circuit is formed on the control board 2. In the control board 2, a large current flows through the power system area 16. By so doing, a common mode noise flows between the case, a power system GND 18 of the first wiring layer 2p, and the power system GND pattern 2hb of the third wiring layer 2r. In the electronic device 1, it is necessary to apply the countermeasure to this common mode noise. In the electronic device of the embodiment 1, in the GND pattern 2h of the third wiring layer 2r as will be described later, the power system GND pattern (the second conductor pattern) 2hb is separated from a logic system GND pattern (a first conductor pattern) 2ha to which a voltage different from that to the power system GND pattern 2hb is applied. In addition, in the first wiring layer 2p, the power system GND 18 and a logic system GND 19 are coupled at one point. This suppresses sneaking of the common mode noise this noise flows through the power system GND pattern 2*hb*, into the logic system GND pattern 2*ha*. The power system GND pattern 2*hb* of the third wiring layer 2*r* and the case (the housing 1*b*) are coupled for GND, thereby reducing the potential difference therebetween and suppressing the common mode noise. As a result, it is possible to avoid a malfunction of the logic system circuit.

In this case, the ground (GND) for use in the electronic device 1 is briefly divided into a signal ground and a frame ground. The signal ground corresponds to a wiring pattern (the logic system GND pattern 2*ha* or the power system GND pattern 2*hb*) which is common to the circuits in the control board 2, while the frame ground corresponds to the metal-made case (the housing 1*b*). The signal ground is a ground for causing a return current to flow, while the frame ground is at a reference potential. In each of the circuits, when the analog circuit is used in the digital circuit, the ground (power system GND) of the analog IC becomes the signal ground in many cases, and the power source is independently provided from a digital circuit. At this time, the source potential is expressed in +V for the signal ground.

It is necessary the signal ground and the frame ground are coupled together at one point to be at the same potential, or they are totally insulated from each other not to be coupled together. The circuit is coupled only to the signal ground, and is coupled to the frame ground at the end. At this time, if the grounding is not appropriately performed, it causes a noise source.

In the electronic device 1 of the embodiment 1, the wiring pattern (the signal ground, the power system GND pattern 2*hb*) which is common to the analog IC is coupled to the case (frame ground, housing 1*b*), thereby electrically coupling the substrate wiring as the signal ground and the case (frame ground). As a result, it is possible to reduce the potential difference between the substrate wiring and the case, thus enabling to suppress the common mode noise.

Descriptions will be now made to each of the wiring layers of the control board 2. As illustrated in FIG. 10, the through holes 2*t* penetrating through the fixing screws 3 for fixing the substrate are separately formed at four points in the first layer (the first wiring layer 2*p*).

Further, five coupling through holes 2*f* to be those coupling terminals (first connector, electrode) 2*e* for inputting which are externally coupled are formed along the peripheral part of the first wiring layer 2*p* on the side of the surface 2*a* of the control board 2. In the illustration, of the five coupling terminals 2*e* (the coupling through holes 2*f*), for example, the second one from the left is a GND input terminal 2*ea*, and is coupled to the power system GND pattern 2*hb* of the third wiring layer 2*r*. That is, this GND input terminal 2*ea* is arranged in a region in which the power system GND pattern 2*hb* is formed, in plan view. In other words, the GND-coupled through electrode 2*d* is famed in the region of the power system GND pattern 2*hb* in which the GND input terminal 2*ea* is formed, in plan view.

Three coupling through holes 2*g* to be the coupling terminals (second connector, electrode) 2*e* for outputting are also provided along the peripheral part.

Electronic parts including the MCU 7, the pre-driver 8, the regulator 9, and a zero-Ω resistor 11 are mounted on the surface 2*a* of the control board 2. Further, in the first wiring layer 2*p*, patterns of the power system GND 18 and the logic system GND 19 are formed, and the power system GND 18 and the logic system GND 19 are coupled at one point by the zero-Ω resistor 11. That is, in the first wiring layer 2*p* of the control board 2, the power system GND 18 and the logic system GND 19 are coupled in a high impedance state.

Descriptions will now be made to the third layer (the third wiring layer 2*r*) of FIG. 12. On the control board 2, in the third wiring layer 2*r*, as the GND pattern 2*h*, the logic system GND pattern (the first GND pattern) 2*ha* and the power system GND pattern (the second GND pattern) 2*hb* are formed, and the logic system GND pattern 2*ha* and the power system GND pattern 2*hb* are separated. Specifically, in the third wiring layer 2*r*, the logic system GND pattern 2*ha* to which a first voltage is applied and the power system GND pattern 2*hb* to which a second voltage greater than the first voltage is applied are separately formed. That is, the logic system GND pattern 2*ha* as a plain wiring formed in a wide area and the power system GND pattern 2*hb* as a plain wiring also formed in a wide area are separately famed.

This is to avoid sneaking of the common mode noise flowing through the power system GND pattern 2*hb*, into the logic system GND pattern 2*ha*. As a result, it is possible to suppress sneaking of the common mode noise flowing through the power system GND pattern 2*hb*, into the logic system GND pattern 2*ha*.

The logic system GND 19 of the first wiring layer 2*p* and the logic system GND pattern 2*ha* of the third wiring layer 2*r* are electrically coupled through a plurality of through electrodes 2*i*. Similarly, the power system GND 18 of the first wiring layer 2*p* and the power system GND pattern 2*hb* of the third wiring layer 2*r* are electrically coupled through a plurality of through electrodes 2*j*.

As described above, the power system GND pattern 2*hb* and the logic system GND pattern 2*ha* which are separated in the third wiring layer 2*r* are coupled in a high impedance state at one point in the third wiring layer 2*p*.

On the control board 2, as illustrated in FIG. 10, of four through holes 2*t* for fixing the substrate using the fixing screw (see FIG. 8) 3 at four points, around two through holes 2*t* arranged over the power system GND pattern 2*hb* of the third wiring layer 2*r* of FIG. 12, a plurality of through electrodes 2*d* are formed. Thus, the conductor pattern 2*dc* of the first wiring layer 2*p* and the power system GND pattern 2*hb* of the third wiring layer 2*r* are electrically coupled by the plurality of through electrodes 2*d* formed around the two through holes 2*dc*.

As illustrated in FIG. 11, specifically, the plurality of through electrodes 2*d*, formed around the two through holes 2*t* in a region overlapping the power system GND pattern 2*hb* of the third wiring layer 2*r* of the first wiring layer 2*p*, are formed along the ring-shaped conductor pattern 2*dc* formed around the through hole 2*t* of the first wiring layer 2*p*. Each of the plurality of through electrodes 2*d* is in contact with the ring-shaped conductor pattern 2*dc*.

According to the electronic device 1 of the embodiment 1, on the control board 2, the power system GND pattern 2*hb* of the third wiring layer 2*r* is fixed to the metal housing (case) 1*b* through the through electrode 2*d*, the washer 6, and the fixing screw 3, thereby enabling to reduce a difference between the GND potential of the control board 2 and the potential of the case. It is possible to reduce the common mode noise flowing through the power system GND pattern 2*hb*. Further, it is possible to realize a noise countermeasure without using a choke coil as a noise countermeasure part.

Because the common mode noise can be reduced, it enables to prevent a malfunction of the logic system circuit on the control board 2.

In the embodiment 1, the descriptions have been made to the case in which the plurality of through electrodes 2*d* are formed around each of the through holes 2*t* on the side of the power system GND pattern 2hb. However, the electric coupling of the power system GND pattern 2hb and the case may be made at least at one point, and the electric coupling of the power system pattern 2hb and the case may be made by at least one through electrode 2d.

On the control board 2, a noise countermeasure is realized, using the existing constituent parts, such as the fixing screw 3 or the through hole 2t. Thus, any additional parts or additional processes are not necessary, thereby enabling to suppress the cost and performing the noise countermeasure.

Further, the case and the power system GND pattern 2hb are coupled for GND, using the fixing screw 3 penetrating the through hole 2t for fixing the substrate, thereby enabling to form a conduction path without having an effect on the mounting area. As a result, it is possible to make multipoint coupling with the case on the fixing part of the substrate, regardless of the mounting area.

Of fixing screws (coupling members) 3 at four points, it is preferred that the fixing screws 3 for electrically coupling the power system GND pattern 2hb and the case include the fixing screw 3 externally coupled and arranged nearest to the GND input terminal (GND terminal, ground terminal) 2ea to which a GND (ground) potential is supplied, in plan view. In other words, of the fixing screws 3 provided at four points, it is preferred that at least the fixing screw 3 arranged at the distance nearest to the GND input terminal 2ea in plan view be electrically coupled to the case.

That is, because the short distance is made between the fixing screw 3 for GND coupling to the case and the GND input terminal 2ea, a path for the GND coupling is formed short, thus resulting in a low impedance. The potential difference between the GND of the substrate and the case can be decreased, thus resulting in suppressing the common mode noise.

It is preferred that the fixing screws 3 for GND coupling to the case be provided at a plurality of points (two points in the embodiment 1). This enables to stabilize the GND for the power system GND through which a large current flows.

In the embodiment 1, the descriptions have been made to the case in which the fixing screws 3 for electrically coupling the substrate GND to the case are arranged at two points. However, it is not limited to two, the number of fixing screws 3 to be arranged may be increased or decreased as necessary.

On the control board, in the third wiring layer 2r, the logic system GND pattern 2ha as a plain wiring and the power system GND pattern 2hb also as a plain wiring are separated from each other. In addition, of the logic system GND pattern 2ha and the power system GND pattern 2hab, only the power system GND pattern 2hb is electrically coupled to the case. That is, only the power system GND pattern 2hb is coupled to the case for GND. This enables to avoid sneaking (entering) of the common mode noise flowing through the logic system GND pattern 2ha, into the logic system GND pattern 2ha. Similarly, the electric coupling of the substrate GND to the case may be performed not only with the power system GND pattern 2hb, but also with the logic system GND pattern 2ha.

It is preferred that a plurality of through electrodes 2d be provided. More preferably, many through electrodes 2d are provided. For example, it is preferred that approximately ten electrodes 2d be provided around the fixing screw 3 for the coupling for GND. If the plurality of through electrodes 2d are provided, the electric resistance of the through electrode 2d can further be decreased.

As illustrated in FIG. 11, it is preferred that a plurality of through electrodes 2d be arranged to surround the through hole 2t for arranging the fixing screw 3 which is provided to electrically couple the power system GND pattern 2hb of FIG. 12 and the case. For example, the plurality of through electrodes 2d are, in plan view, arranged in a ring-like form to surround the through hole 2t. The arrangement form of the plurality of through electrodes 2d may simply surround the through hole 2t at least from three sides, and is not limited to the ring-like form. Because the plurality of through electrodes 2d are arranged to surround the through hole 2t, it is possible to alleviate the restriction on the wiring designing on the control board 2. That is, the plurality of through electrodes 2d are arranged in positions close to the through hole 2t as much as possible, thereby enabling to keep the minimum region necessary for forming the through electrodes 2d. As a result, it is possible to alleviate the restriction on the wiring designing.

On the surface 2a (or the back surface 2b) of the control board 2, a plurality of MOSFETs 15 as switching elements are mounted. The plurality of MOSFETs 15 are electrically coupled to the power system GND pattern 2hb of the third wiring layer 2r.

Further, in the first wiring layer 2p of the control board 2, the patterns of the power system GND 18 and the logic system GND 19 are formed. The power system GND 18 and the logic system GND 19 are coupled by the zero-Ω resistor 11 at one point.

Then, the coupling is made in a high impedance state, and the noise is not likely to flow. Thus, it is possible to suppress propagation of the common mode noise flowing through the power system GND 18, into the logic system GND 19.

Figure 13:
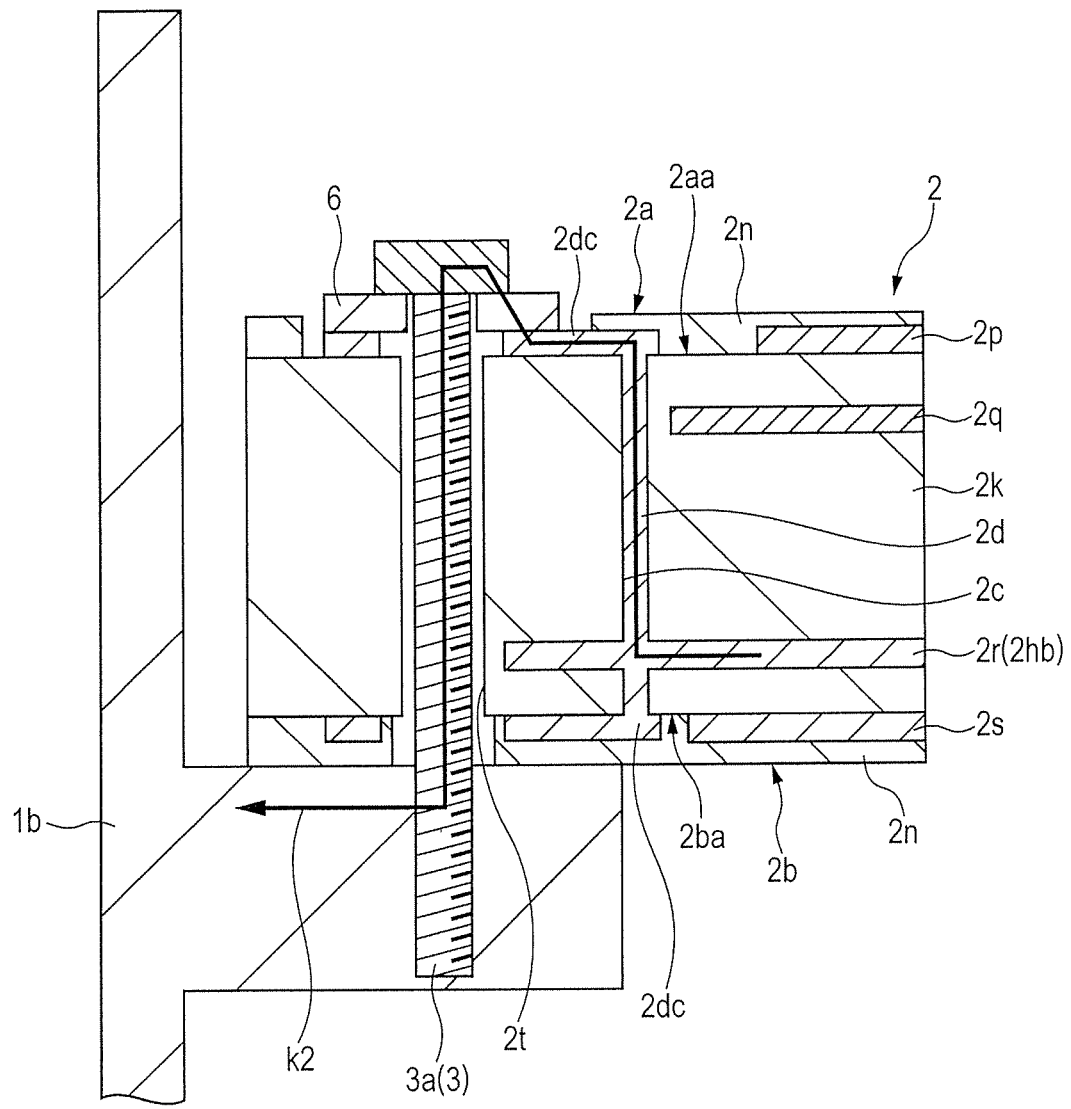
FIG. 13 is a partially enlarged cross sectional view showing a substrate fixing structure of a modification of the wiring substrate mounted on the electronic device of FIG. 1.

Descriptions will now be made to a modification of the embodiment 1. FIG. 13 is a partially enlarged cross sectional view showing a substrate fixing structure of the modification of the wiring substrate mounted on the electronic device of FIG. 1.

In the modification of the embodiment 1, in the substrate fixing structure for GND coupling of the control board 2, the through electrode 2d formed around the through hole 2t for arranging the fixing screw 3 for the GND coupling is provided in a position coming off (deviated) to the outside (in a direction far from the fixing screw 3) from the right below the washer 6, in plan view. This enables to avoid damaging the through electrode 2d due to fastening pressure of the fixing screw 3 and the washer 6 at the time of fixing the substrate.

In the substrate fixing structure of FIG. 13, the power system GND pattern 2hb of the third wiring layer 2r is coupled to the housing (case) 1b for GND via the through electrode 2d, the washer 6, and the fixing screw 3, using a conduction path k2.

Embodiment 2

Figure 14:
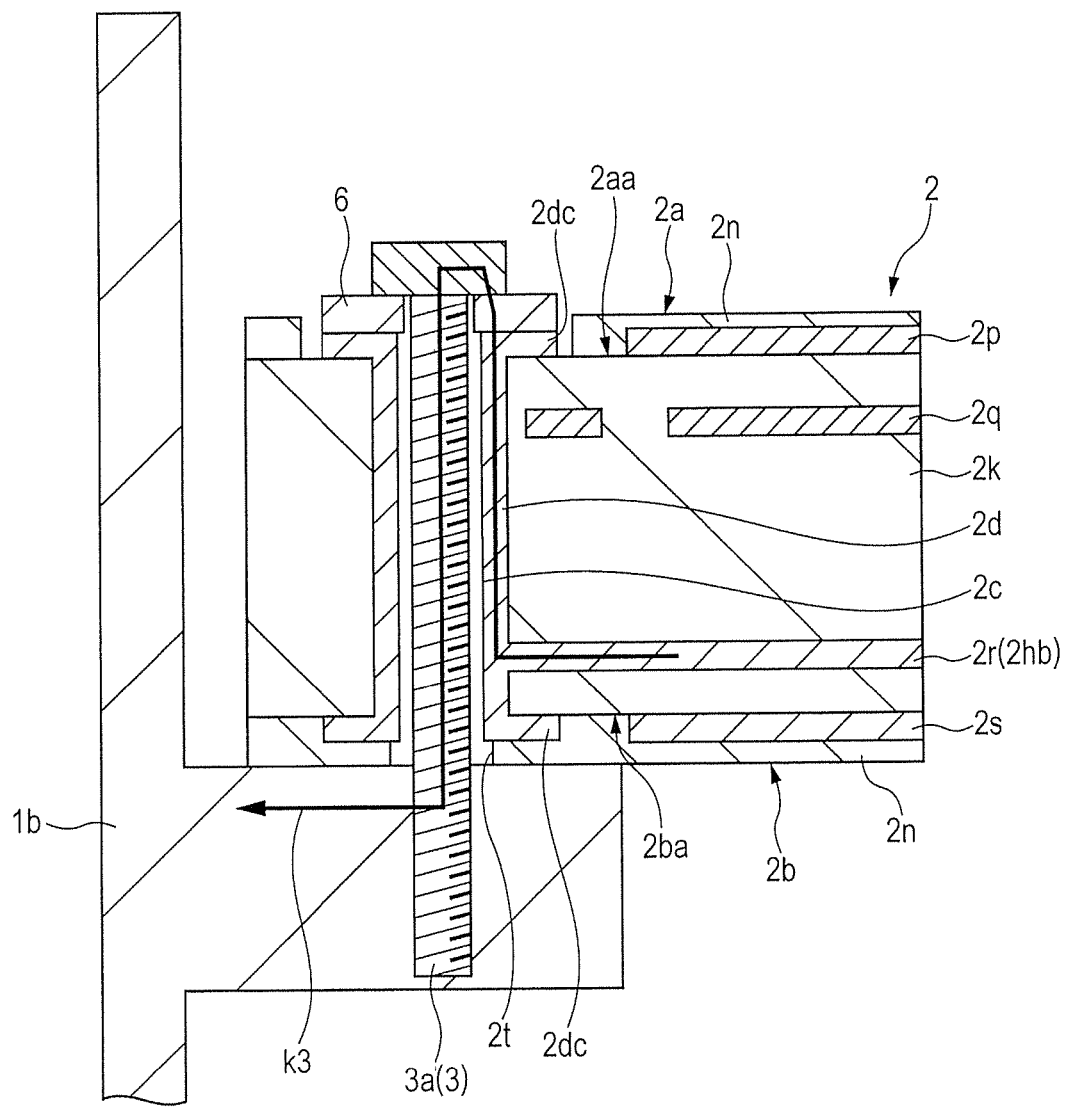
FIG. 14 is a partially enlarged cross sectional view showing an example of a substrate fixing structure of a wiring substrate of an embodiment 2.

FIG. 14 is a partially enlarged cross sectional view showing an example of a substrate fixing structure of a wiring substrate of an embodiment 2.

In the embodiment 2, in the through hole 2t for arranging the fixing screw (coupling member) 3 for performing the GND coupling, a plating film (a conductor film) 2u is formed on the inner wall of the through hole 2t. This plating film 2u is used as a conduction layer for the substrate surface layer. That is, the plating film 2u formed on the inner wall of the through hole 2t is used as the through electrode 2d. In the substrate fixing structure illustrated in FIG. 14, the power system GND pattern 2hb of the third wiring layer 2r is coupled to the housing (case) 1b for GND through the plating film (through electrode 2d) 2u, the washer 6, and the fixing screw 3, using a conduction path k3. That is, using the conduction path k3, the power system GND pattern 2hb of the third wiring layer 2r of the control board 2 and the housing 1b as the case are electrically coupled.

By this structure, the power system GND pattern 2hb of the third wiring layer 2r is coupled to the housing (case) 1b for GND via the through electrode 2d, the washer 6, and the fixing screw 3, using the conduction path k3. That is, the power system GND pattern 2hb of the third wiring layer 2r of the control board 2 and the housing 1b as the case are electrically coupled using the conduction path k3.

By the substrate fixing structure of the embodiment 2, there is no need to provide the through electrode for extracting the GND from the power system GND pattern 2hb of the third wiring layer 2r as the inner layer of the control board 2 to the first wiring layer 2p on the side of the surface 2a. Further, there is no need to ensure the space for arranging the above-described through electrode(s). Thus, it is possible to ensure the space for any other wiring.

Because there is no need to provide the above-described through electrode on the control board 2, it is possible to keep the minimum region in which the wiring formation is allowed.

Figure 15:
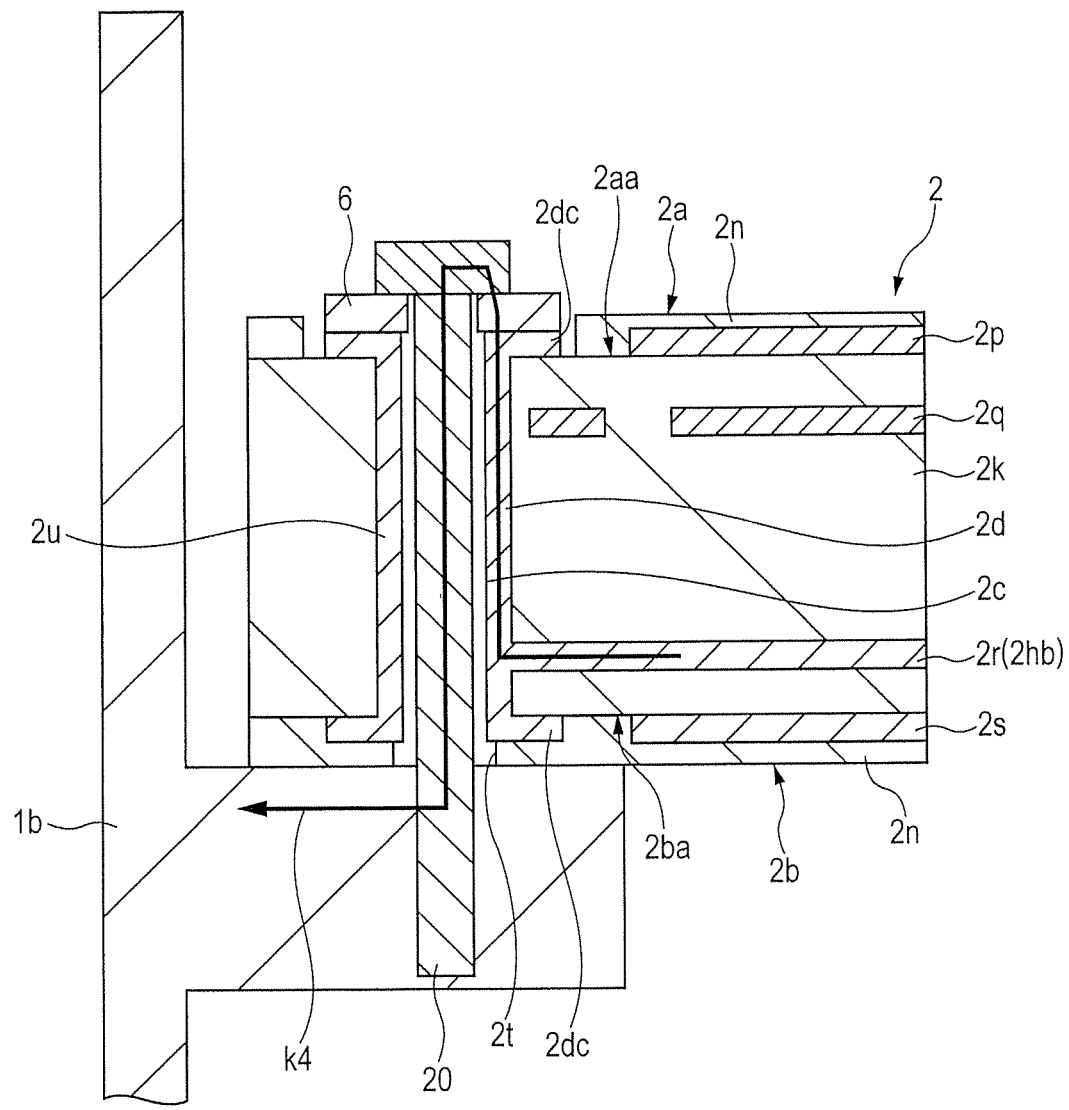
FIG. 15 is a partially enlarged cross sectional view showing a substrate fixing structure of a first modification of the embodiment 2.

Descriptions will now be made to a modification of the embodiment 2. FIG. 15 is a partially enlarged cross sectional view showing a substrate fixing structure of a first modification of the embodiment 2.

In the first modification of the embodiment 2, the descriptions will be made to a case in which the coupling member for performing GND coupling is a metal press-in pin (a pin member) 20. That is, the press-in pin 20 is used as the coupling member for the coupling to the case for GND. This press-in pin 20 is press-fitted to the housing (case) 1b, for conducting between the coupling member and the case.

In the substrate fixing structure of the first modification illustrated in FIG. 15, the power system GND pattern 2hb of the third wiring layer 2r of the control board 2 is coupled to the housing (case) 1b for GND via the plating film (through electrode 2d) 2u, the washer 6, the press-in pin 20, using a conduction path k4. That is, the power system GND pattern 2hb of the third wiring layer 2r of the control board 2 and the housing 1b as the case are electrically coupled, using the conduction path k4.

When the control board 2 is fixed, for example, to the case at four points, of four coupling members for use in fixing the substrate, in plan view, it is preferred that the press-in pins 20 be used for the through hole 2t in the position nearest to the GND input terminal 2ea illustrated in FIG. 10, or for two of the through hole 2t in the position nearest to the GND input terminal 2ea and one another through hole 2t.

This is because, when the press-in pin 20 is adopted, the position accuracy of the pressing-in is very high. Further, if the pressing-in is adopted at four points, the positional variation of the points cannot be absorbed. Thus, it is preferred that the press-in pin 20 be adopted, in plan view, only at one point, that is, for the through hole 2t in the position nearest to the GND input terminal 2ea. At most, it is adopted at two points, that is, for the through hole 2t in the position nearest to the GND input terminal 2ea and another through hole 2t.

In the substrate fixing structure of the first modification illustrated in FIG. 15, recessing/projecting parts are not formed on the side surface of the press-in pin 20, unlike the screw. Thus, it is possible to avoid damaging the plating film 2u of the inner wall of the through hole 2t.

Figure 16:
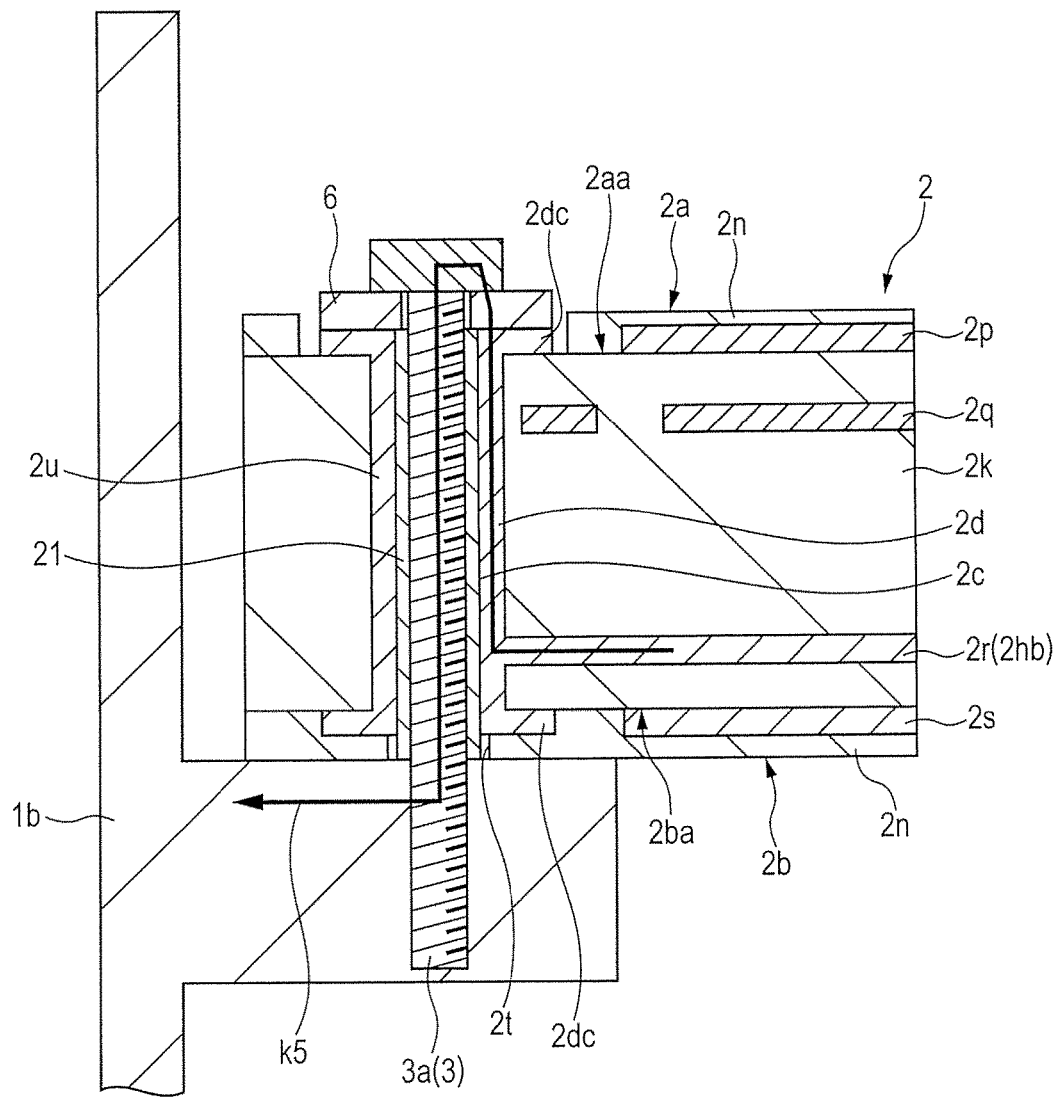
FIG. 16 is a partially enlarged cross sectional view showing a substrate fixing structure of a second modification of the embodiment 2.

Descriptions will now be made to a second modification of the embodiment 2. FIG. 16 is a partially enlarged cross sectional view showing a substrate fixing structure of the second modification of the embodiment 2.

In the second modification of the embodiment 2, descriptions will be made to a case in which the metal fixing screw 3 is used as the coupling member for the GND coupling, and a metal (or may be made of a resin) sleeve 21 is arranged in the through hole 2t. That is, the fixing screw 3 is used as the coupling member for performing the GND coupling to the case, and this fixing screw 3 is screwed to the housing (case) 1b, for conducting between the fixing screw 3 and the case. Further, the sleeve 21 arranged in the through hole 2t is arranged, and the fixing screw 3 is arranged in the hole of this sleeve 21. As a result, the side surface of the fixing screw 3 is covered by the sleeve 21. In other words, the wall of the sleeve 21 is arranged between the fixing screw 3 and the plating film 2u formed on the inner wall of the through hole 2t. Threads of the fixing screw 3 are not in contact with the plating film 2u.

In the substrate fixing structure of the second modification illustrated in FIG. 16, the power system GND pattern 2hb of the third wiring layer 2r of the control board 2 is coupled to the housing (case) 1b for GND through the plating film (through electrode 2d) 2u, the washer 6, and the fixing screw 3, using a conduction path k5. That is, the power system GND pattern 2hb of the third wiring layer 2r of the control board 2 and the housing 1b as the case are electrically coupled, using the conduction path k5.

In the substrate fixing structure of the second modification illustrated in FIG. 16, the threads of the fixing screw 3 are not in contact with the plating film 2u. Thus, it is possible to avoid damaging the plating film 2u formed on the inner wall of the through hole 2t.

Figure 17:
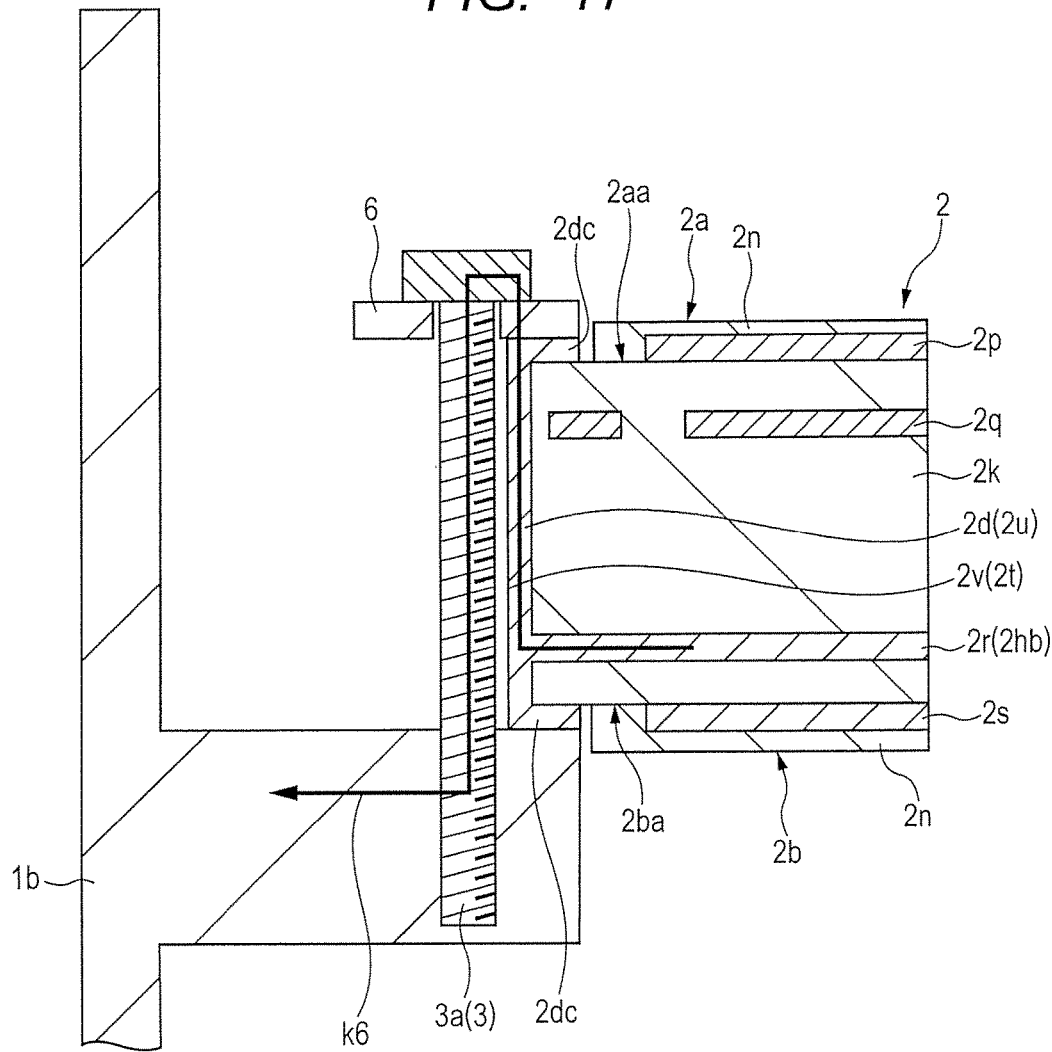
FIG. 17 is a partially enlarged cross sectional view showing a substrate fixing structure of a third modification of the embodiment 2.
Figure 18:
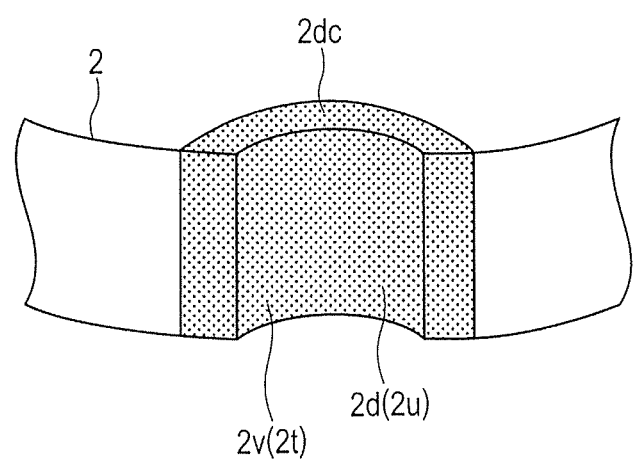
FIG. 18 is a partially enlarged perspective view showing a structure of a through electrode of the wiring substrate of FIG. 17.
Figure 19:
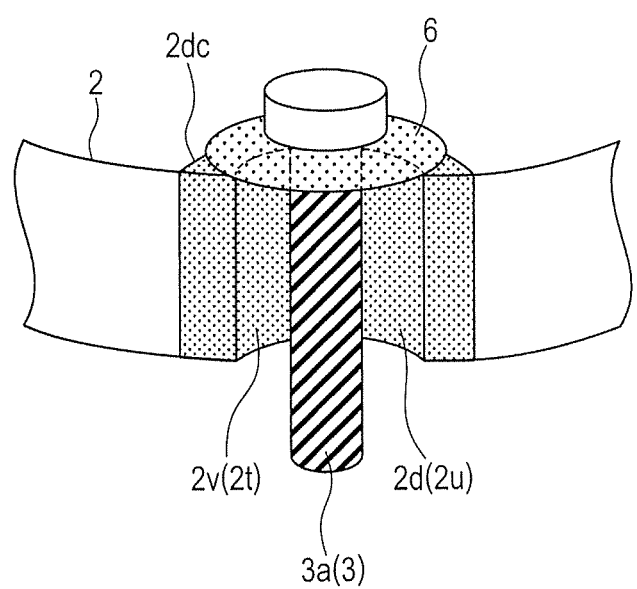
FIG. 19 is a partially enlarged perspective view showing a substrate fixing structure using the through electrode of FIG. 18.

Descriptions will now be made to a third modification of the embodiment 2. FIG. 17 is a partially enlarged cross sectional view showing a substrate fixing structure of the third modification of the embodiment 2. FIG. 18 is a partially enlarged perspective view showing a structure of a through electrode of the wiring substrate of FIG. 17. FIG. 19 is a partially enlarged perspective view showing an example of a substrate fixing structure using the through electrode of FIG. 18.

In the third modification of the embodiment 2, at the end part of the control board 2 on which the fixing screw 3 for performing the GND coupling is arranged, a notch part is formed as illustrated in FIG. 18 and FIG. 19, and the substrate is fixed using the fixing screw 3 using this notch part 2v. This notch part 2v is formed by notching the through hole 2t, as illustrated in FIG. 14, for example. It can be seen that a part of the through hole 2t is exposed to the side surface of the control board 2.

The notch part 2v has the plating film 2u formed as a conductor film. Further, an arc-like conductor pattern (another conductor pattern) 2dc is formed along a part of the outer peripheral part of the fixing screw 3, on the third surface 2aa and the fourth surface 2ba coupled from the notch part 2v, illustrated in FIG. 17. That is, the plating film 2u formed on the notch part 2v is coupled to the conductor pattern 2dc formed on the third surface 2aa and the fourth surface 2ba.

Using this notch part 2v, as illustrated in FIG. 17, the control board 2 is fixed to the housing (case) 1b via the washer 6, using the fixing screw 3. Then, the power system GND pattern 2hb of the third wiring layer 2 of the control board 2 is coupled to the housing (case) 1b for GND via the plating film (through electrode 2d) 2u, the washer (a plate conductor member) 6, and the fixing screw 3, using a conduction path k6. That is, the power system GND pattern 2*hb* of the third wiring layer 2*r* of the control board 2 is electrically coupled to the housing 1*b* as a case, using the conduction path k6. In the substrate fixing structure illustrated in FIG. 17, the control board 2 is fixed using the fixing screw 3 in a manner that a part of the housing 1*b* is in contact directly with the conductor pattern 2*dc* formed on the fourth surface 2*ba* on the side of the back surface 2*b* of the control board 2.

The conduction path k6 includes a path through which the plating film 2*u* is directly coupled to the housing 1*b* via the conductor pattern 2*dc*, in addition to a path passing through the fixing screw 3.

In the substrate fixing structure of the third modification, the notch part 2*v* may preferably be formed at least at one point of the end part in which the fixing screw 3 for performing the GND coupling is arranged.

In the substrate fixing structure of the third modification of the embodiment 2 illustrated in FIG. 17, the side surface of the fixing screw 3 is not entirely covered by the plating film 2*u*, thus enabling to reduce that the plating film 2*u* is in contact with the threads of the fixing screw 3. As a result, it is possible to reduce damage to the plating film 2*u*. In the conduction path k6, it is possible to form a path for coupling the power system GND pattern 2*hb* of the third wiring layer 2*r* without through the fixing screw 3 directly to the housing 1*b* directly through the plating film 2*u* and the conductor pattern 2*dc*. As a result, the number of GND-coupling paths increases, thus realizing the coupling in a low impedance state.

Embodiment 3

Figure 20:
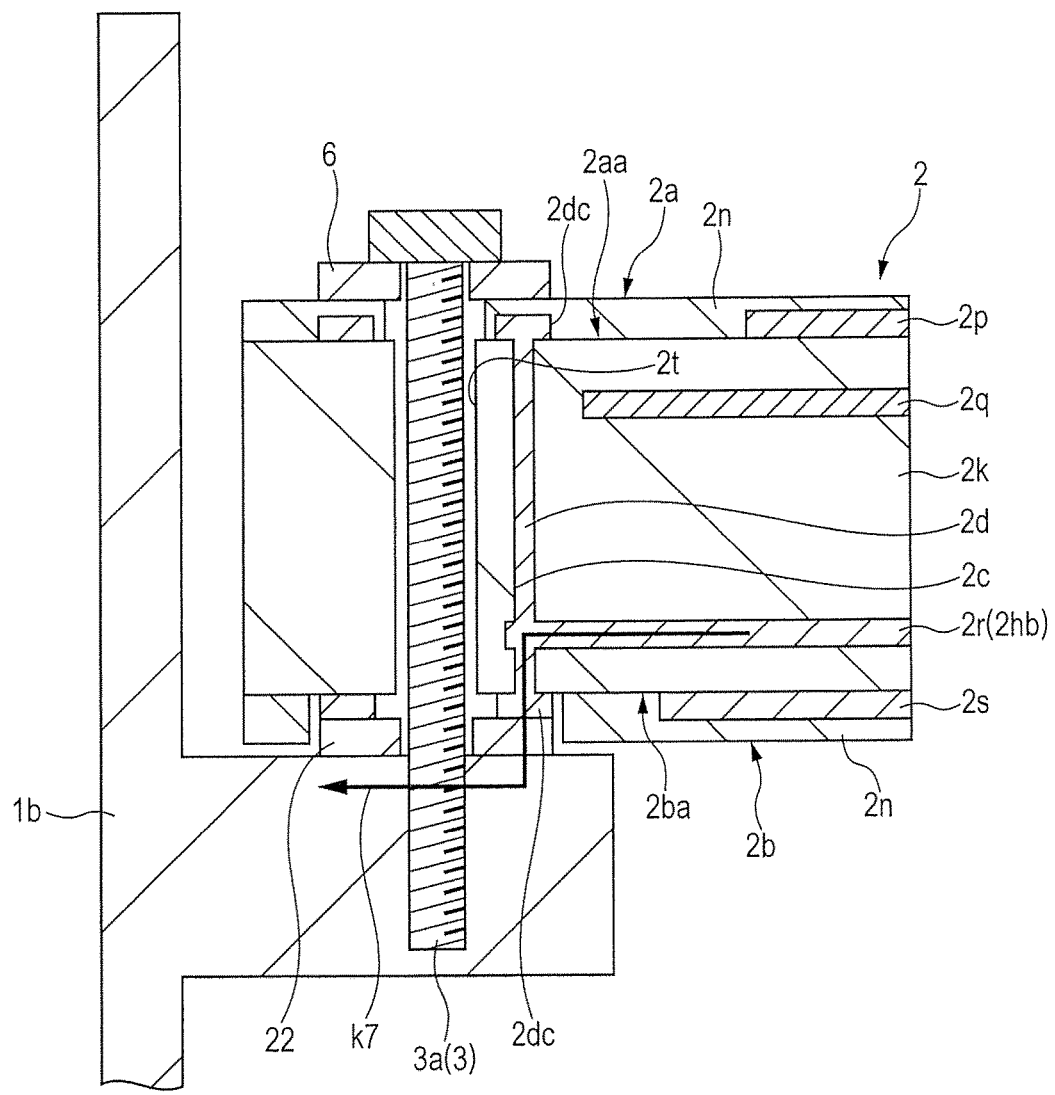
FIG. 20 is a partially enlarged cross sectional view showing an example of a substrate fixing structure of a wiring substrate of an embodiment 3.

FIG. 20 is a partially enlarged cross sectional view showing an example of a substrate fixing structure of an embodiment 3.

The substrate fixing structure of the embodiment 3 is provided for attempting GND coupling without through the fixing screw 3, by arranging a spacer 22 between the control board 2 and the housing (case) 1*b*, on the side of the back surface 2*b* of the control board 2. That is, on the side of the back surface 2*b* of the control board 2, the metal spacer 22 intervenes between the through electrode 2*d* and the housing 1*b* in a manner that it is in contact with the conductor pattern 2*dc* of the through electrode 2*d* and the housing 1*b*. The control board 2 is fixed to the case using the fixing screw 3 in a manner that the spacer 22 is in contact with the conductor pattern 2*dc* of the through electrode 2*d*.

As a result, the power system GND pattern 2*hb* is electrically coupled to the housing (case) 1*b* via the through electrode 2*d*, the conductor pattern 2*dc*, and the spacer 22, using a conduction path k7.

The spacer 22 may, for example, be a metal-faulted washer 6. It is not limited that the spacer 22 is formed of metal, or may be formed of, for example, a resin containing conductive particles or a conductive member including a tape member. It may be formed of a conductive member including a conductive material, such as aluminum foil.

In the substrate fixing structure of the embodiment 3, the conduction path can be shorter, and the contact resistance with the case can be lower than those of the embodiments 1 and 2. Thus, the GND coupling with the case can be performed in a low impedance state. As a result, it is possible to enhance the strength of the GND coupling with the case.

Because the distance passing through the through electrode 2*d* is short, it hardly has to do with the reliability of the through electrode 2*d*.

Because the spacer 22 is arranged between the conductor pattern 2*dc* formed on the fourth surface 2*ba* of the back surface 2*b* side of the control board 2 and the contact surface of the case, it is possible to improve the vibration prevention effect of the control board 2, by using a material having a vibration prevention mechanism as the material of the spacer 22.

Figure 21:
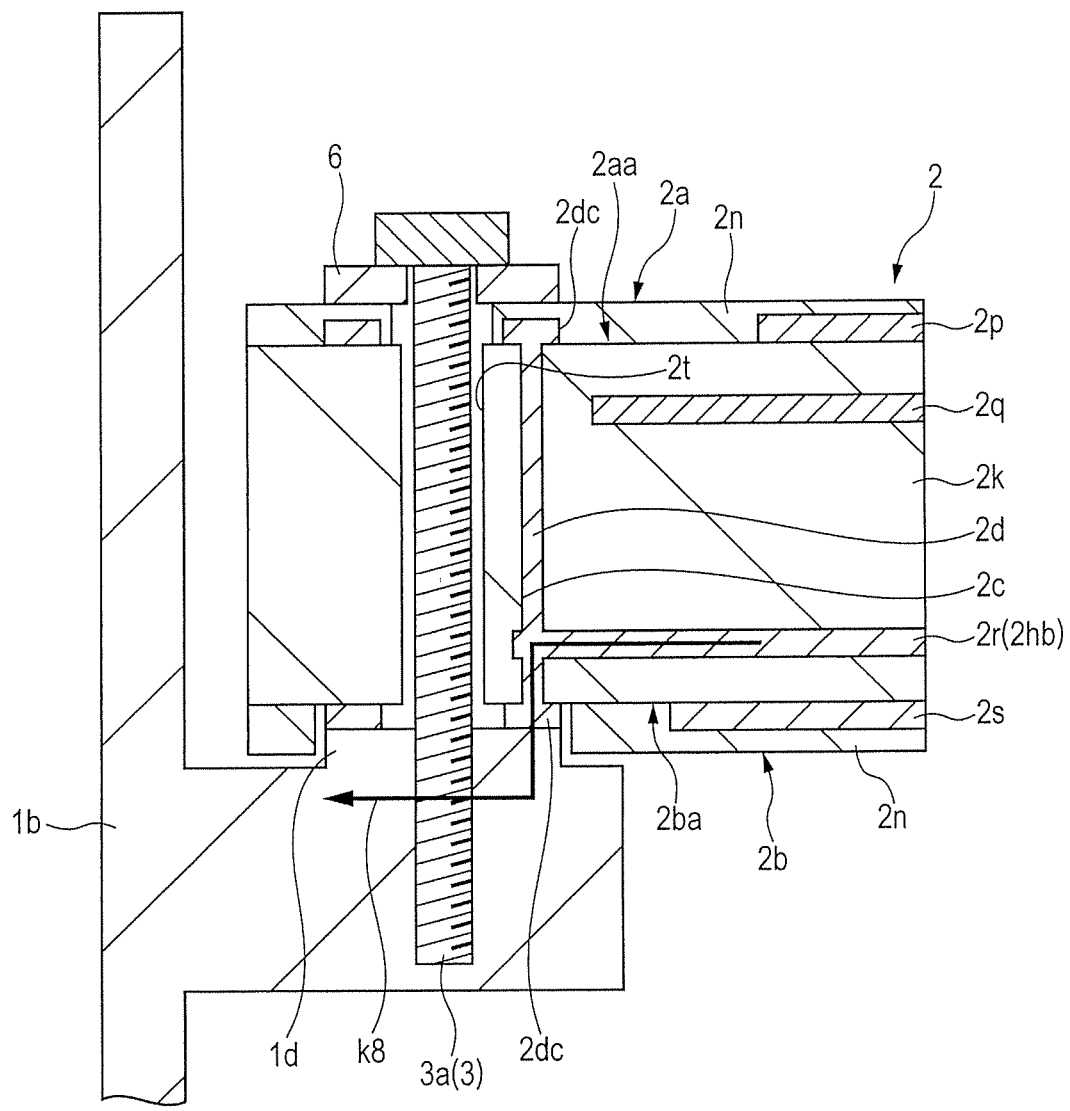
FIG. 21 is a partially enlarged cross sectional view showing a substrate fixing structure of a first modification of the embodiment 3.

Descriptions will not be made to a first modification of an embodiment 3. FIG. 21 is a partially enlarged cross sectional view showing a substrate fixing structure of a first modification of the embodiment 3.

In a substrate fixing structure of the first modification of the embodiment 3, a projecting part 1*d* projecting toward the substrate side (upward) is formed on the case part in contact with the back surface 2*b* of the control board 2. In addition, the conductor pattern 2*dc* of the through electrode 2*d* is made in contact directly with the projecting part 1*d* of the case, without through the fixing screw 3. That is, the projecting part 1*d* projecting to the side of the control board 2 (upward) is formed on the case, and the control board 2 is fixed to the case using the fixing screw 3 in a manner that the projecting part 1*d* is directly in contact with the through electrode 2*d*.

As a result, the power system GND pattern 2*hb* is electrically coupled to the case through the through electrode 2*d* and the projecting part 1*d*. That is, the power system GND pattern 2*hb* is electrically and directly coupled to the case through the conductor pattern 2*dc* of the through electrode 2*d* and the projecting part 1*d* of the housing (case) 1*b*, using a conduction path k8.

It is preferred that the plane shape of the projecting part 1*d* be approximately the same as the ring-shaped conductor pattern 2*dc*. Further, the contact part of the projecting part 1*d* in contact with the conductor pattern 2*dc* is preferably in a form to be in contact with the plane (for example, the same form as the washer 6). As a result, the through electrode 2*d* and the case can electrically be coupled in a low impedance state.

The substrate fixing structure for directly coupling the projecting part 1*d* of the case to the conductor pattern 2*dc* of the through electrode 2*d* can be combined with the substrate fixing structure in which the notch part 2*v* is formed at the end part of the control board 2 in the third modification of the above-described embodiment 2 illustrated in FIG. 17 to FIG. 19.

In the substrate fixing structure of the first modification of the embodiment 3, it is possible to reduce the number of parts, because the spacer 22 illustrated in FIG. 20 is not used. Further, due to the reduction of the number of parts, it is possible to improve the assemblability in the substrate fixing structure.

Figure 22:
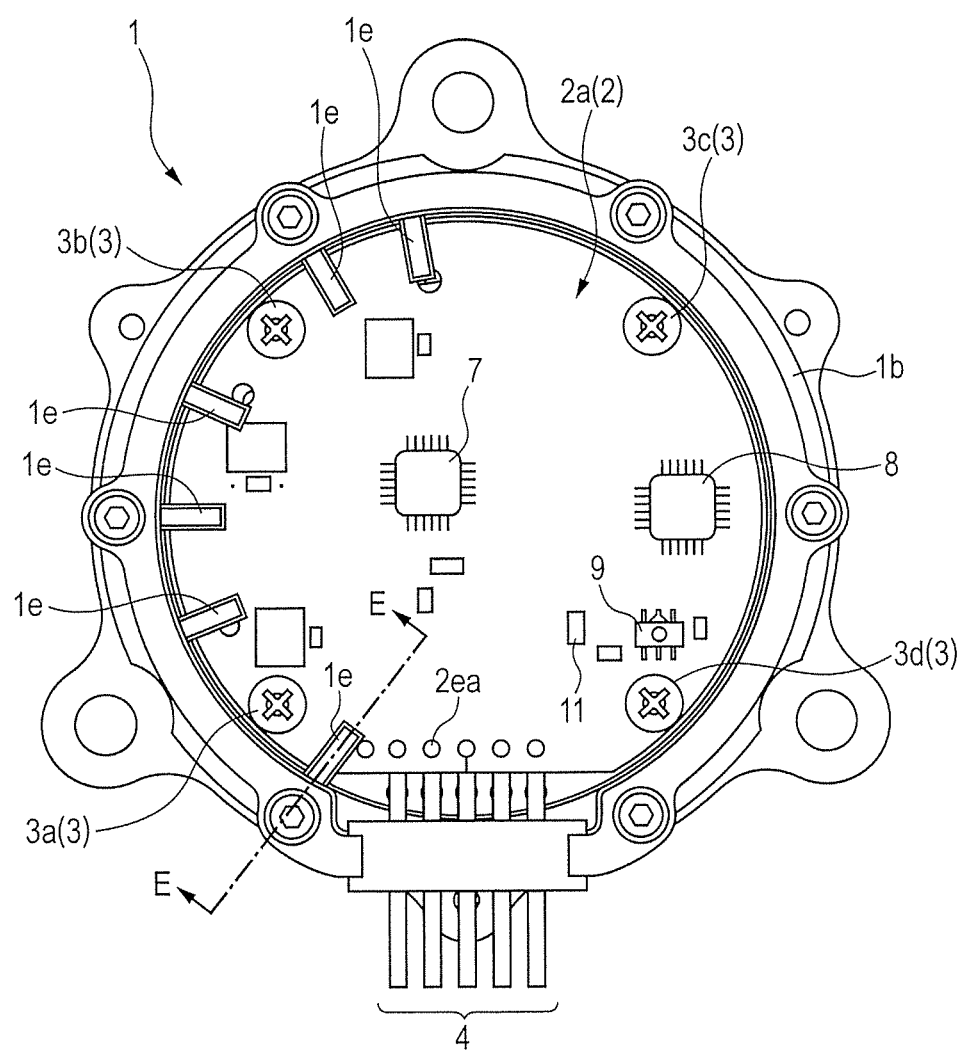
FIG. 22 is a plan view showing a substrate fixing structure of a second modification of the embodiment 3.
Figure 23:
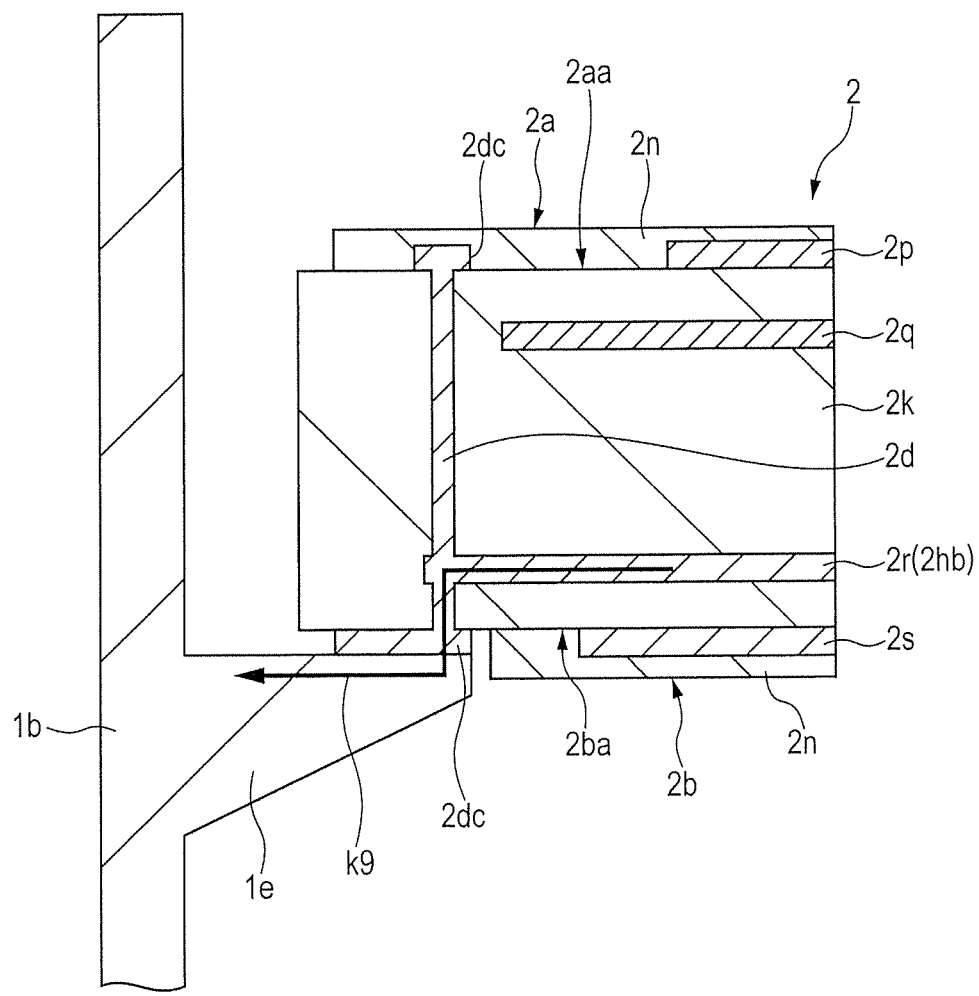
FIG. 23 is a partially enlarged cross sectional view showing a structure taken along a line E-E of FIG. 22.

Descriptions will now be made to a second modification of the embodiment 3. FIG. 22 is a plan view showing a substrate fixing structure of the second modification of the embodiment 3. FIG. 23 is a partially enlarged cross sectional view showing a structure taken along a line E-E of FIG. 22.

In the substrate fixing structure of the second modification of the embodiment 3, the control board 2 and a rib 1*e* are made directly in contact with each other as illustrated in FIG. 23, using the rib 1*e* for holding the substrate provided on the case (housing 1*b*) in addition to the fixing screw 3 as a path for performing the coupling for GND. That is, as illustrated in FIG. 2, a plurality of ribs 1*e* are provided on the housing 1*b*. As illustrated in FIG. 23, the ribs 1*e* are made directly in contact with the conductor pattern 2*dc* of the through electrode 2*d* of the control board 2. At this time, the coupling for GND using the ribs 1*e* is auxiliary made, and the main coupling for GND is made using the fixing screw 3 as described in the embodiments 1 and 2.

In this case, it is possible to form a conduction path k9 including the through electrode 2d and the rib 1e, independently from the GND-coupled conduction path using the fixing screw 3, as illustrated in FIG. 23. The rib 1e may be provided at one point, or may also be provided at a plurality of points.

In the substrate fixing structure of the second modification of the embodiment 3, the conduction path k9 including the rib 1e is formed, thereby enabling to increase the number of coupled points of the through electrode 2d and the case, without increasing the number of fixing through holes for passing through the fixing screw 3. In particular, if the ribs 1e are provided at a plurality of points, it is possible to form a plurality of conduction paths k9, thereby enabling to couple the through electrode 2d and the case at other points.

The GND coupled points are made by providing the rib 1e of the case in a position closer to the GND input terminal 2ea, thereby forming a short path for the GND coupling and attaining the coupling in a low impedance state.

Embodiment 4

Figure 24:
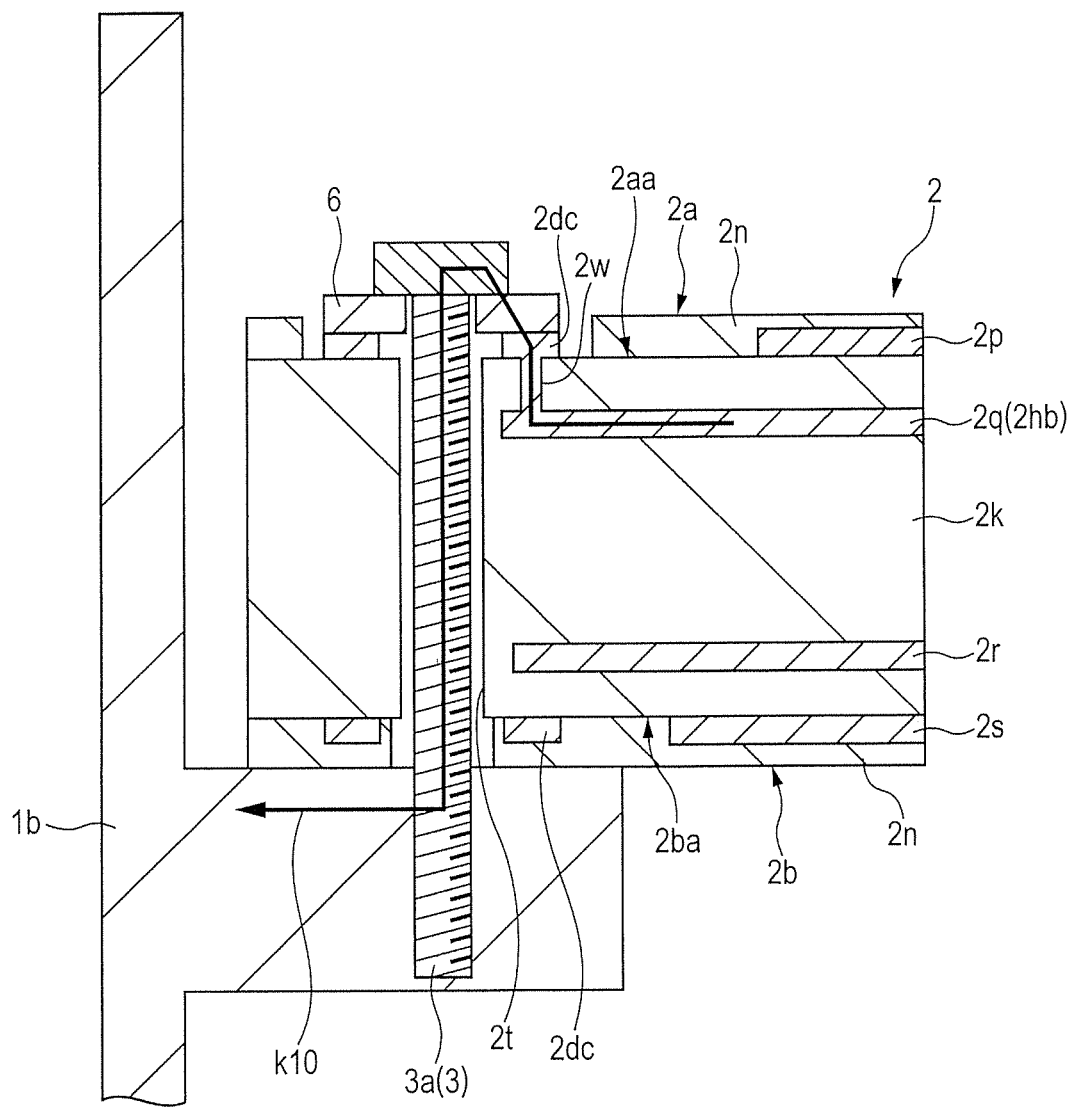
FIG. 24 is a partially enlarged cross sectional view showing an example of a substrate fixing structure of a wiring substrate of an embodiment 4.

FIG. 24 is a partially enlarged cross sectional view showing an example of a substrate fixing structure of a wiring substrate of an embodiment 4. In the embodiment 4, descriptions will now be made to a case in which the control board (wiring substrate) 2 is a build-up substrate. In the above-described embodiments 1 to 3, the descriptions have been made to the case in which the control board 2 is a subtractive substrate. In the embodiment 4, the descriptions will be made to a case in which the build-up substrate is used as the control board 2.

The control board 2 illustrated in FIG. 24 is a build-up substrate. For example, the second wiring layer 2q is a GND layer. When this second wiring layer 2q has the power system GND pattern 2hb formed therein, the power system GND pattern 2hb of the second wiring layer 2q and the washer 6 are coupled for GND via the via 2w.

By this structure, the power system GND pattern 2hb is electrically coupled to the case (housing 1b) via the via 2w, the conductor pattern 2dc, the washer 6, and the fixing screw 3. That is, the power system GND pattern 2hb of the first wiring layer 2p of the control board 2 is electrically coupled to the housing 1b as the case via the via 2w, using a conduction path k10.

Even if the build-up substrate is adopted as the control board 2, it is possible to realize a reduction in the common mode noise and to attain the same effects of the above-described embodiments 1 to 3.

Figure 25:
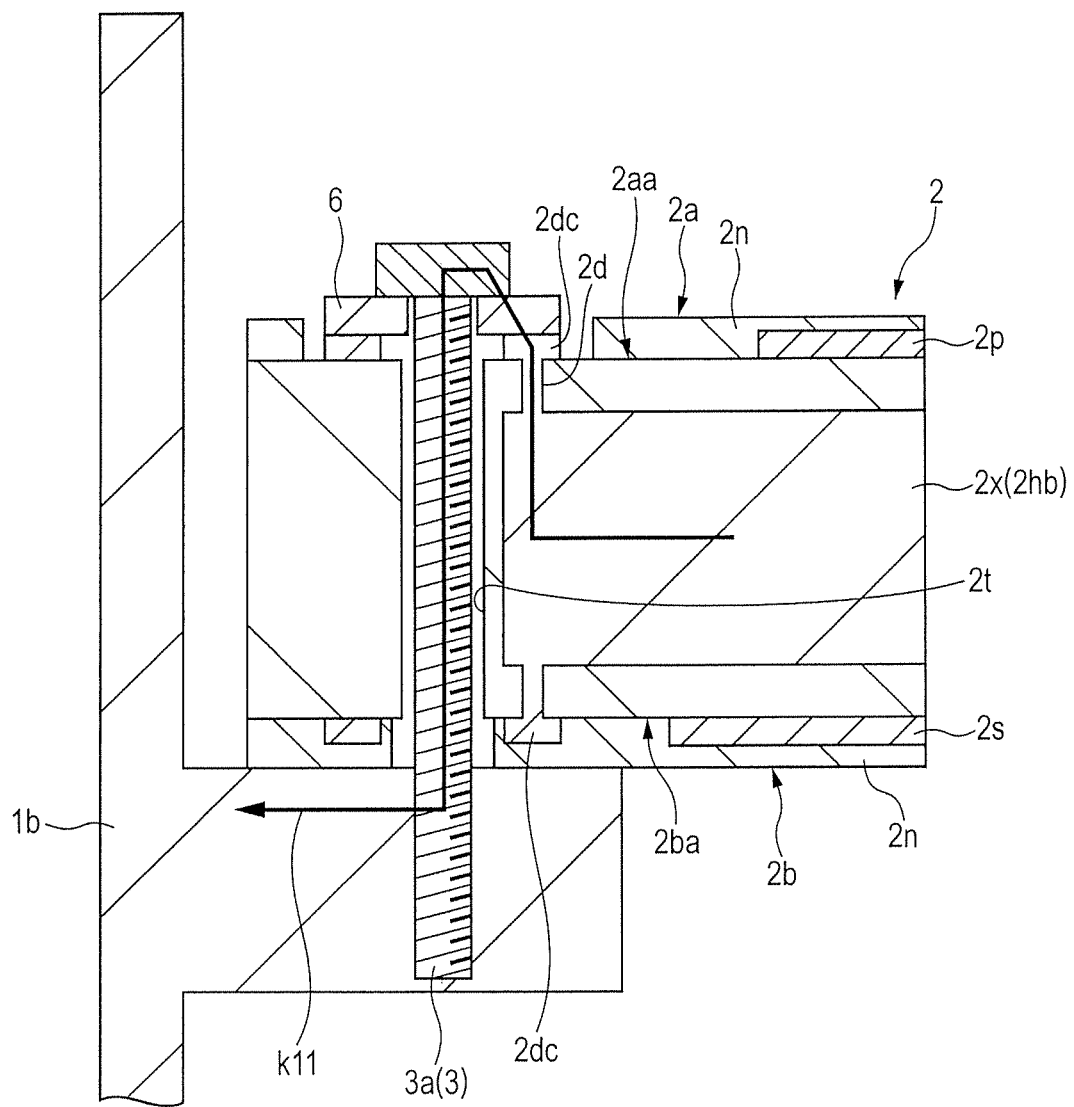
FIG. 25 is a partially enlarged cross sectional view showing a substrate fixing structure of a modification of the embodiment 4.

Descriptions will now be made to a modification of an embodiment 4. FIG. 25 is a partially enlarged cross sectional view showing a substrate fixing structure of the modification of the embodiment 4.

In the modification of the embodiment 4, descriptions will now be made to a case in which a Cu core substrate is used as the control board 2. The control board 2 illustrated in FIG. 25 is a Cu core substrate, and is a metal layer 2x having an inner core layer foiled of Cu. This metal layer 2x is a GND layer, and has the power system GND pattern 2hb formed therein. Further, the power system GND pattern 2hb and the washer 6 are coupled for GND via the through electrode 2d. In this case, the through electrode 2d is coupled to the conductor pattern 2dc on the surface/back surface of the control board 2, through the metal layer 2x.

As a result, the power system GND pattern 2hb is electrically coupled to the case (housing 1b) via the through electrode 2d, the conductor pattern 2dc, the washer 6, and the fixing screw 3. That is, the power system GND pattern 2hb of the core layer (metal layer 2x) of the control board 2 is electrically coupled to the housing 1b as the case through the through electrode 2d, using a conduction path k11.

In this manner, even if the Cu core substrate is adopted as the control board 2, it is possible to realize a reduction in the common mode noise and to attain the same effect as those of the above-described embodiments 1 to 3.

Accordingly, the descriptions have specifically been made to the inventions made by the present inventors, based on the preferred embodiments. However, the present invention is not limited to the above-described embodiments. Various changes may possibly be made without departing from the scope thereof.

For example, in the above-described embodiments 1 to 4, the descriptions have been made to the case in which the motor 5 incorporated in the electronic device 1 is applied to an electric oil pump for realizing idling stopping for vehicles. However, the motor 5 may be coupled to any member other than the above electric oil pump.

What is claimed is:

1. An electronic device comprising:
    a wiring substrate which has a first surface, a second surface opposite the first surface, and a plurality of wiring layers arranged between the first surface and the second surface; and
    a metal-made case which supports the wiring substrate,
    wherein the wiring substrate includes
        a first through hole which penetrates from one surface to other surface, of a surface on which an uppermost wiring layer of the wiring layers is formed and a surface on which a lowermost wiring layer is formed,
        a through electrode which is formed inside the first through hole, and
        a conductor pattern which is formed on a wiring layer positioned on a side inner, in a substrate thickness direction, than the uppermost and lowermost layers, of the wiring layers,
    wherein the conductor pattern and the case are electrically coupled through the through electrode,
    wherein the wiring substrate is fixed to the case using a plurality of metal-made coupling members,
    wherein, of the coupling members, at least one first coupling member is electrically coupled to the conductor pattern,
    wherein the wiring substrate is electrically coupled to the conductor pattern on the first surface and the second surface, and has a ground terminal which is externally and mechanically connected to a lead wire to which a ground potential is supplied,
    wherein the coupling members are provided at a plurality of points, respectively, and
    wherein, of the coupling members provided at the points, the at least one first coupling member is disposed at a straight distance nearest to the ground terminal in plan view and is electrically and mechanically connected to the case.

2. The electronic device according to claim 1,
    wherein the conductor pattern and the case are electrically coupled through another conductor pattern formed on at least any one surface, of the surface on which the uppermost wiring layer is formed and the surface on which the lowermost wiring layer is formed.

3. The electronic device according to claim 1,
wherein the conductor pattern and the case are electrically coupled through another conductor pattern arranged along at least one part of an outer peripheral part of a coupling member for fixing the wiring substrate and the case.

4. The electronic device according to claim 3,
wherein the conductor pattern and the case are electrically coupled through the another conductor pattern and a plate conductor member being in contact with the another conductor pattern.

5. The electronic device according to claim 1,
wherein the coupling members are fixing screws, and
wherein at least one first fixing screw as the at least one first coupling member is electrically and mechanically connected to the metal-made case of a motor.

6. The electronic device according to claim 5,
wherein the wiring substrate is a control board for controlling the motor.

7. The electronic device according to claim 6,
wherein, of the fixing screws as the coupling members arranged at the points, a plurality of fixing screws including the at least one first fixing screw are electrically coupled to the case.

8. The electronic device according to claim 7,
wherein the coupling members including the coupling member at the straight distance nearest to the ground terminal in the plan view and electrically coupled to the conductor pattern are arranged in a region overlapping a region in which the conductor pattern is formed.

9. The electronic device according to claim 1,
wherein, a first conductor pattern different from the conductor pattern and a second conductor pattern as the conductor pattern are separately formed on the wiring layer on which the conductor pattern is formed.

10. The electronic device according to claim 8,
wherein the ground terminal is arranged in a region overlapping a region in which the second conductor pattern is formed in plan view.

11. The electronic device according to claim 1,
wherein the through electrode is formed in a region overlapping a region of the conductor pattern on which the ground terminal is formed in plan view.

12. The electronic device according to claim 11,
wherein the through electrode includes a plurality of through electrodes.

13. The electronic device according to claim 11,
wherein the through electrodes are provided to surround the coupling member for electrically coupling the conductor pattern and the case in plan view.

14. The electronic device according to claim 1,
wherein the conductor pattern is electrically coupled to a switching element mounted on any of the first surface and the second surface of the wiring substrate.

15. The electronic device according to claim 1,
wherein the wiring substrate is fixed to the case using a metal-made coupling member,
wherein the first surface is a surface of the uppermost layer of the wiring substrate,
wherein the second surface is a surface of the lowermost layer of the wiring substrate,
wherein the coupling member is arranged in a second through hole opened to the surface of the uppermost layer and the surface of the lowermost layer of the wiring substrate,
wherein the through electrode is formed from a conductor film formed on an inner wall of the second through hole, and
wherein the conductor pattern is electrically coupled to the case through the conductor film and the coupling member.

16. The electronic device according to claim 15,
wherein the coupling member is a pin member which is press-fitted to the case.

17. The electronic device according to claim 1,
wherein a conductive member intervenes between the through electrode and the case, to be in contact with the through electrode and the case, and
wherein the conductor pattern is electrically coupled to the case through the through electrode and the conductive member.

18. The electronic device according to claim 1,
wherein a projecting part projecting to a side of the wiring substrate is formed on the case,
wherein the wiring substrate is fixed to the case using a metal coupling member in a manner that the projecting part is in contact with the through electrode, and
wherein the conductor pattern is electrically coupled to the case through the through electrode and the projecting part.

* * * * *